(12) United States Patent
Hoang et al.

(10) Patent No.: US 12,184,191 B2
(45) Date of Patent: Dec. 31, 2024

(54) POWER CONVERSION DEVICE

(71) Applicant: ROHM CO., LTD., Kyoto (JP)

(72) Inventors: Tan Nhat Hoang, Kyoto (JP); Yoshihisa Tsukamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 225 days.

(21) Appl. No.: 18/010,392

(22) PCT Filed: Jul. 1, 2021

(86) PCT No.: PCT/JP2021/025009
§ 371 (c)(1),
(2) Date: Dec. 14, 2022

(87) PCT Pub. No.: WO2022/059297
PCT Pub. Date: Mar. 24, 2022

(65) Prior Publication Data
US 2023/0299688 A1 Sep. 21, 2023

(30) Foreign Application Priority Data
Sep. 17, 2020 (JP) .................. 2020-156395

(51) Int. Cl.
*H02M 7/00* (2006.01)
*H02M 1/088* (2006.01)
(52) U.S. Cl.
CPC ........... *H02M 7/003* (2013.01); *H02M 1/088* (2013.01)
(58) Field of Classification Search
CPC ..... G06F 1/263; H02M 1/10; H02M 3/33561; H02M 7/003; H02M 1/088; H02M 3/088;
(Continued)

(56) References Cited

U.S. PATENT DOCUMENTS 11,735,492 B2 * 8/2023 Lu .................. H01L 29/2003
257/76
2011/0199800 A1 8/2011 Yahata et al.
(Continued)

FOREIGN PATENT DOCUMENTS

| CN | 111049661 A | 4/2020 |
| DE | 11 2013 001 486 T5 | 11/2014 |
| EP | 3 694 093 A1 | 8/2020 |
| JP | 2011-243839 A | 12/2011 |

OTHER PUBLICATIONS

Office Action received in the corresponding German Patent application, Oct. 27, 2023, and machine translation (19 pages).
(Continued)

*Primary Examiner* — Jeffrey A Gblende
(74) *Attorney, Agent, or Firm* — HSML P.C.

(57) ABSTRACT

Provided are switching elements 4, gate driver ICs 5 controlling the switching elements, and substrate 1 carrying the gate driver ICs. Substrate 1 includes base 2 and conductive portion 3 with obverse and reverse surface conductive layers 31, 32. Obverse surface conductive layer 31 includes first connection portion 311 connected to control signal output terminal 51 of gate driver IC 5, second connection portion 312 connected to gate electrode 411 of switching element 4, and first wiring portion 313 interposed between first and second connection portions 311, 312. At least one obverse surface-side first electronic component 61 is provided on obverse surface of substrate 1, forming a circuit portion connecting first and second connection portions 311, 312 together with first wiring portion 313. No conductive member penetrating through base 2 in the thickness direction is connected to first wiring portion 313. These configurations increase the speed of drive control.

18 Claims, 19 Drawing Sheets

(58) Field of Classification Search
CPC .. H02M 3/1584; H02M 3/1566; H02M 1/084; H02M 3/003; H02M 3/33523; H01L 25/112; H01L 25/115; H01L 23/34; H01L 23/528; H01L 27/088; H01L 29/088; H01L 29/2003; H01L 23/49503; H01L 23/49562; H01L 23/49575; H01L 23/62; H01L 23/072; H01L 23/0248; H01L 29/1033; H01L 29/402; H01L 29/41758; H01R 13/6675; H01R 29/00; H01R 31/065; G09G 3/20; H02K 11/046; H01F 2027/406; H01F 27/30; H01F 41/0246; H05K 7/20927; H05K 2201/10166; H05K 2201/10507; H05K 7/2089

See application file for complete search history.

(56) References Cited

U.S. PATENT DOCUMENTS

| | | | | |
|---|---|---|---|---|
| 2014/0008793 | A1* | 1/2014 | Suzuki | H01L 23/53214 257/737 |
| 2017/0353119 | A1* | 12/2017 | Uchida | H01L 23/645 |
| 2020/0021207 | A1* | 1/2020 | Donat | H02M 7/003 |
| 2020/0212909 | A1 | 7/2020 | Ramabhadran et al. | |

OTHER PUBLICATIONS

International Search Report issued in PCT/JP2021/025009, Sep. 28, 2021 (2 pages).

\* cited by examiner

POWER CONVERSION DEVICE

TECHNICAL FIELD

The present disclosure relates to a power conversion device.

BACKGROUND ART

Various power conversion devices including switching elements such as MOSFETs have been proposed. Patent Document 1 discloses an example of a conventional power conversion device. In the power conversion device, input power is converted and output in accordance with a control signal input to a switching element. Examples of applications of such a power conversion device include a motor drive power source.

PRIOR ART DOCUMENTS

Patent Document
Patent Document 1: JP-A-2011-243839

SUMMARY OF THE INVENTION

Problem to be Solved by the Invention

A power conversion device is required to have an even higher speed (higher frequency of the control signal).

The present disclosure has been conceived under the above circumstances, and an object of the present disclosure is to provide a power conversion device capable of increasing the speed of drive control.

Means for Solving the Problem

In accordance with the present disclosure, there is provided a power conversion device including: a plurality of switching elements that each have a gate electrode, a source electrode, and a drain electrode; a plurality of gate driver ICs configured to perform drive control of the plurality of switching elements, respectively; and a substrate on which the plurality of gate driver ICs are mounted. The substrate includes: an insulating base having an obverse surface and a reverse surface that face mutually opposite sides in a thickness direction; and a conductive portion that is supported by the base. The conductive portion includes an obverse surface conductive layer arranged on the obverse surface and a reverse surface conductive layer arranged on the reverse surface. The obverse surface conductive layer includes: a first connection portion to which a control signal output terminal of one of the gate driver ICs; a second connection portion to which the gate electrode of a corresponding one of the switching elements; and a first wiring portion that is interposed between the first connection portion and the second connection portion. The power conversion device further comprises at least one obverse surface-side first electronic component that is mounted on the obverse surface and forms a circuit portion connecting the first connection portion and the second connection portion together with the first wiring portion. The first wiring portion is connected to no conductive member penetrating through the base in the thickness direction.

Advantages of the Invention

According to the power conversion device of the present disclosure, it is possible to increase the speed of drive control.

Other features and advantages of the present disclosure will become more apparent with the detailed description given below with reference to the accompanying drawings.

MODE FOR CARRYING OUT THE INVENTION

Hereinafter, preferred embodiments of the present disclosure will be specifically described with reference to the drawings.

Terms such as "first," "second," and "third" in the present disclosure are used simply for identification purposes and are not necessarily intended to impart permutation to those objects.

First Embodiment

FIGS. 1 to 13 show a power conversion device according to a first embodiment of the present disclosure. The power conversion device A1 of the present embodiment includes a substrate 1, a power module 40, a plurality of gate driver ICs 5, and a plurality of electronic components 6. The power conversion device A1 is an apparatus that converts input power using the switching function of the power module 40, and thereafter outputs the result. The application of the power conversion device A1 is not limited in any way, and in the present embodiment, a case where input DC power is converted into three-phase AC power for driving a motor will be described as an example.

Figure 1:
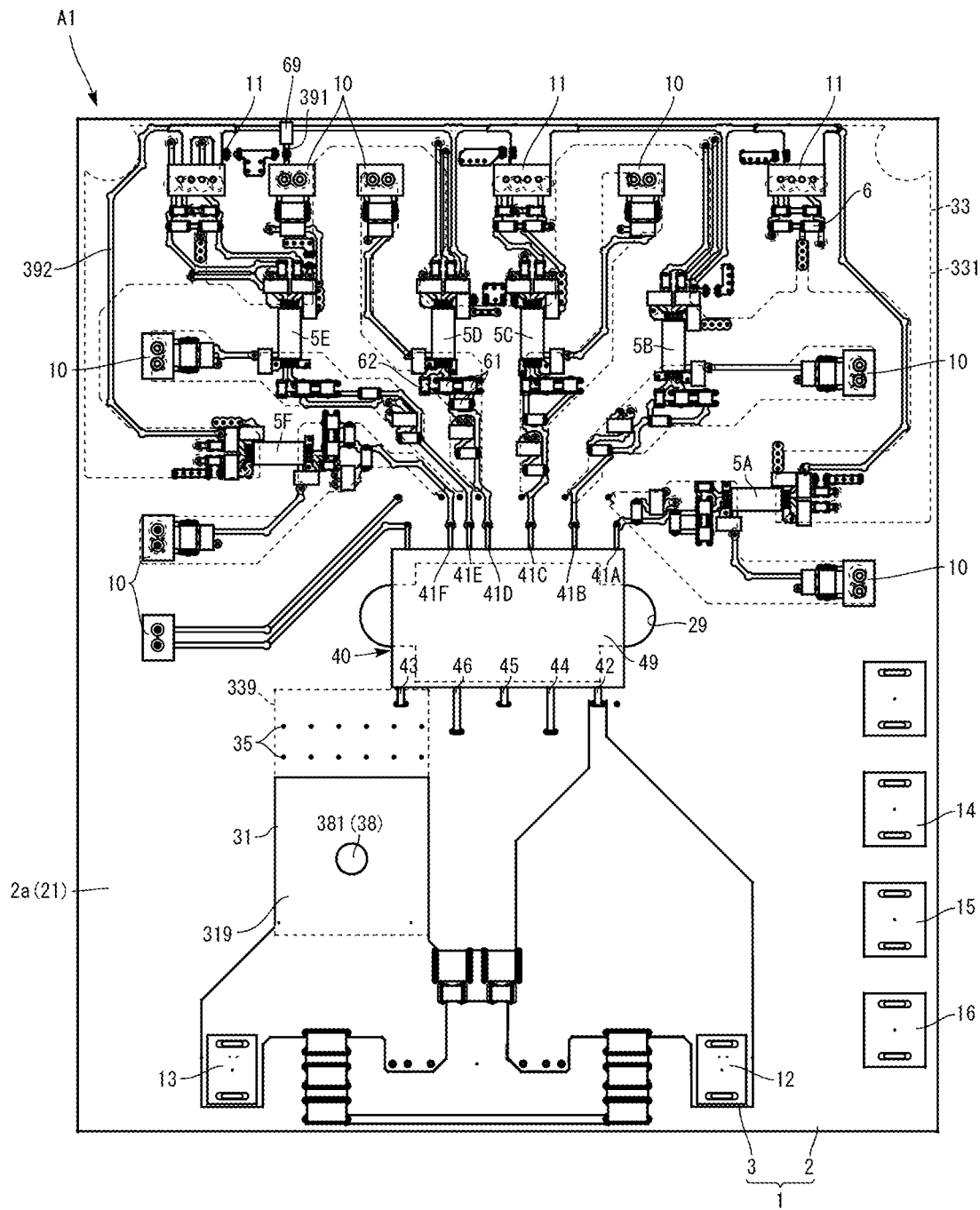
FIG. 1 is a plan view showing a power conversion device according to a first embodiment of the present disclosure.
Figure 2:
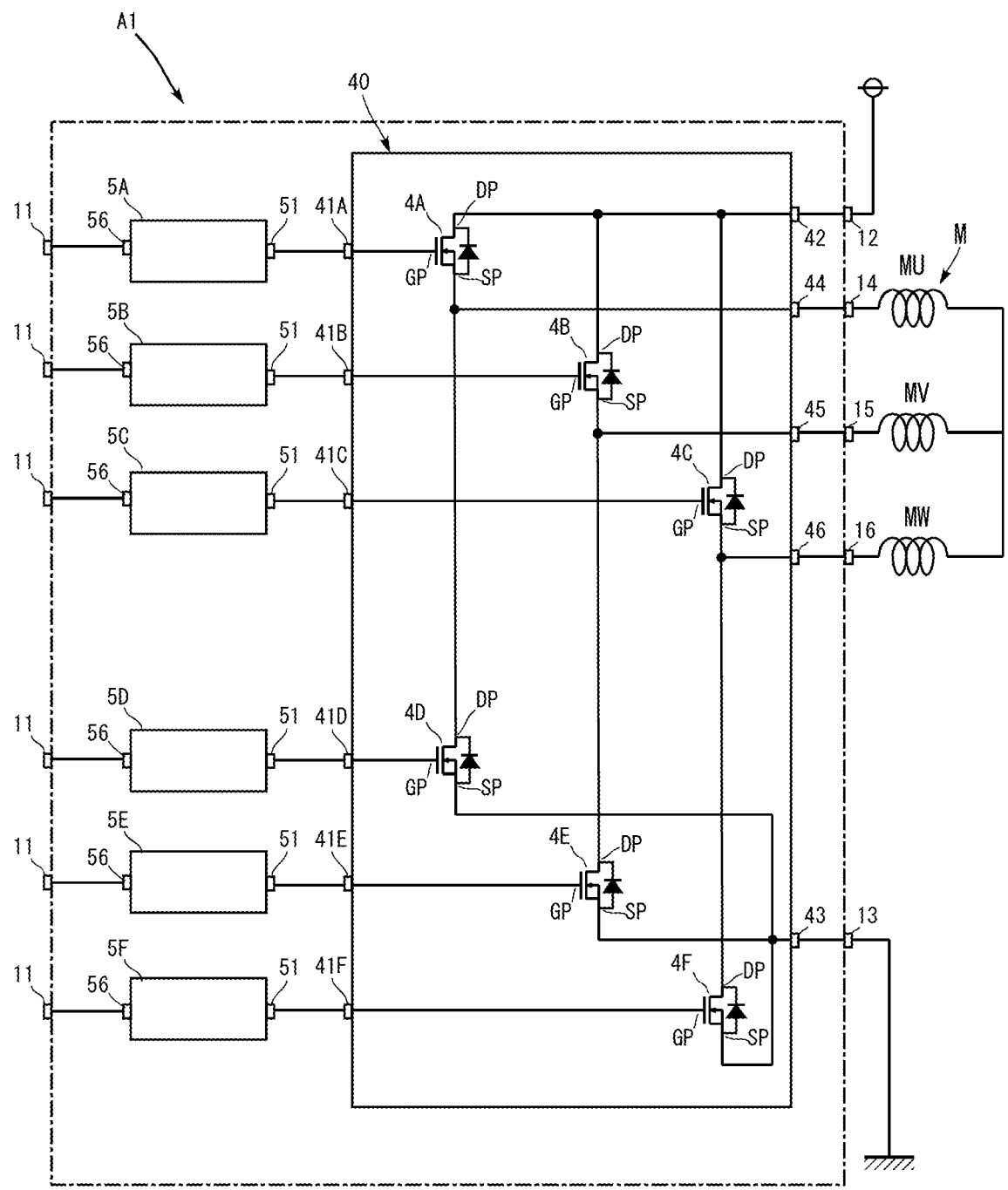
FIG. 2 is a diagram showing an example of a circuit configuration of the power conversion device according to the first embodiment of the present disclosure.
Figure 3:
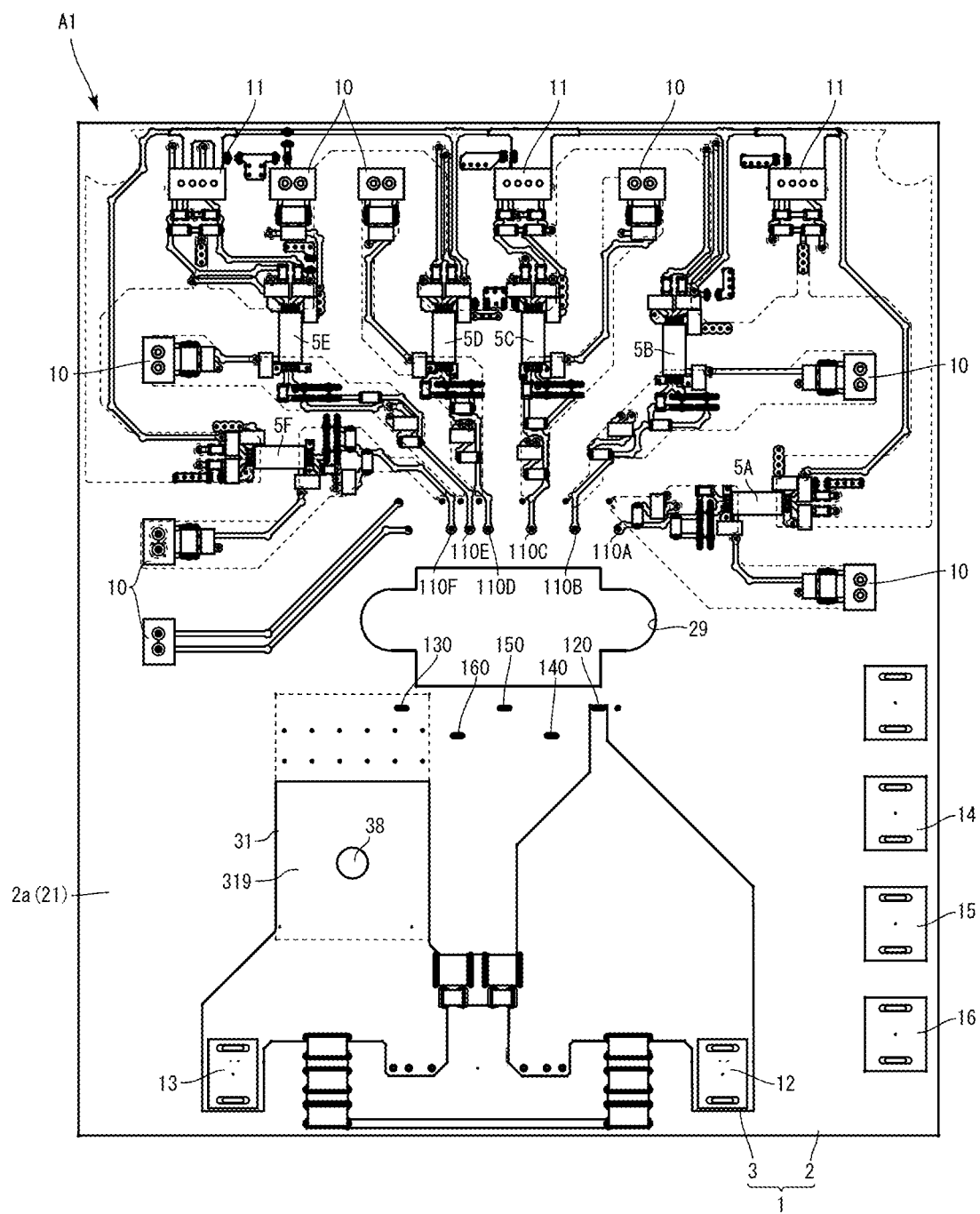
FIG. 3 is a plan view of a main portion showing the power conversion device according to the first embodiment of the present disclosure.
Figure 4:
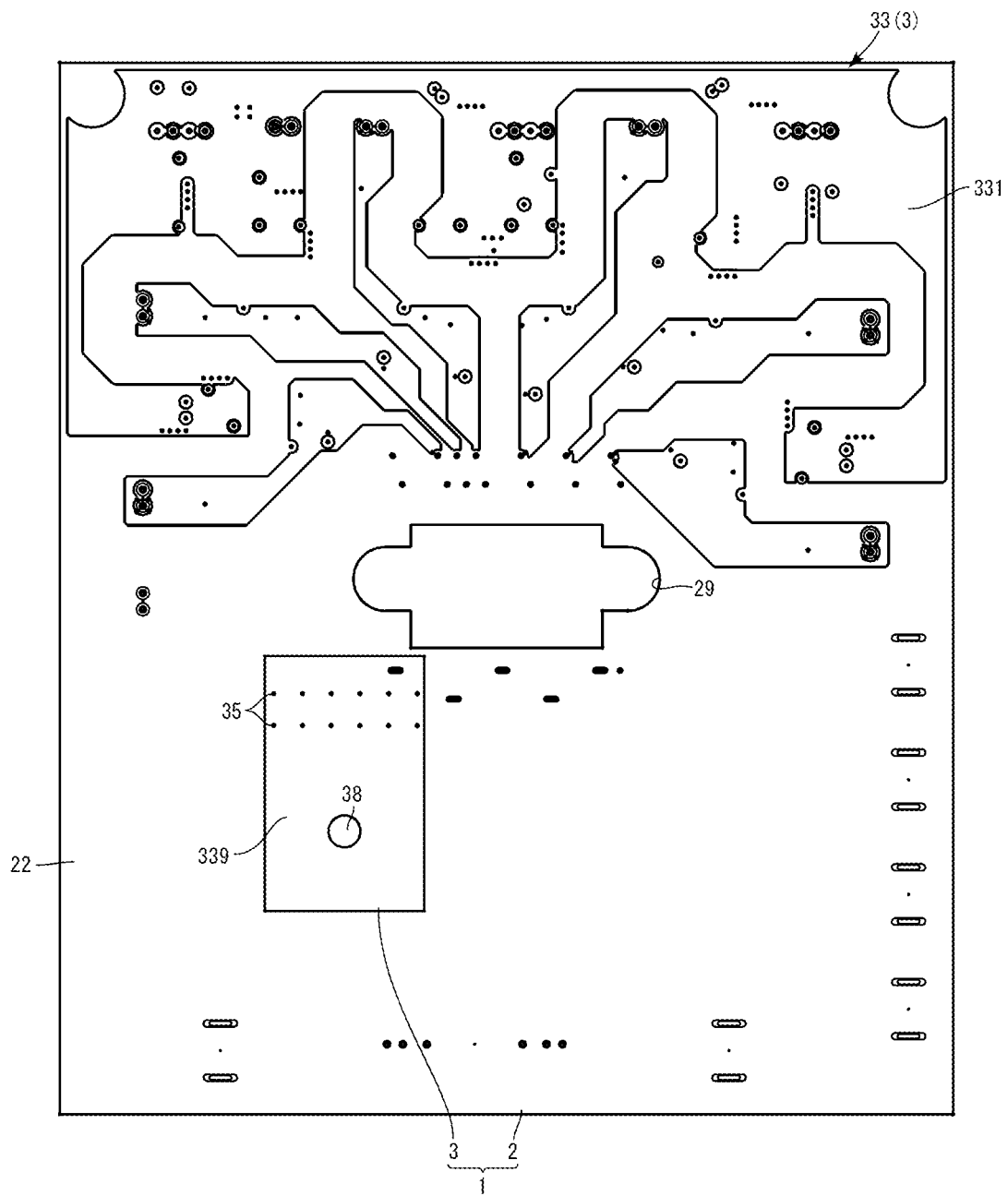
FIG. 4 is a plan view of a main portion showing the power conversion device according to the first embodiment of the present disclosure.
Figure 5:
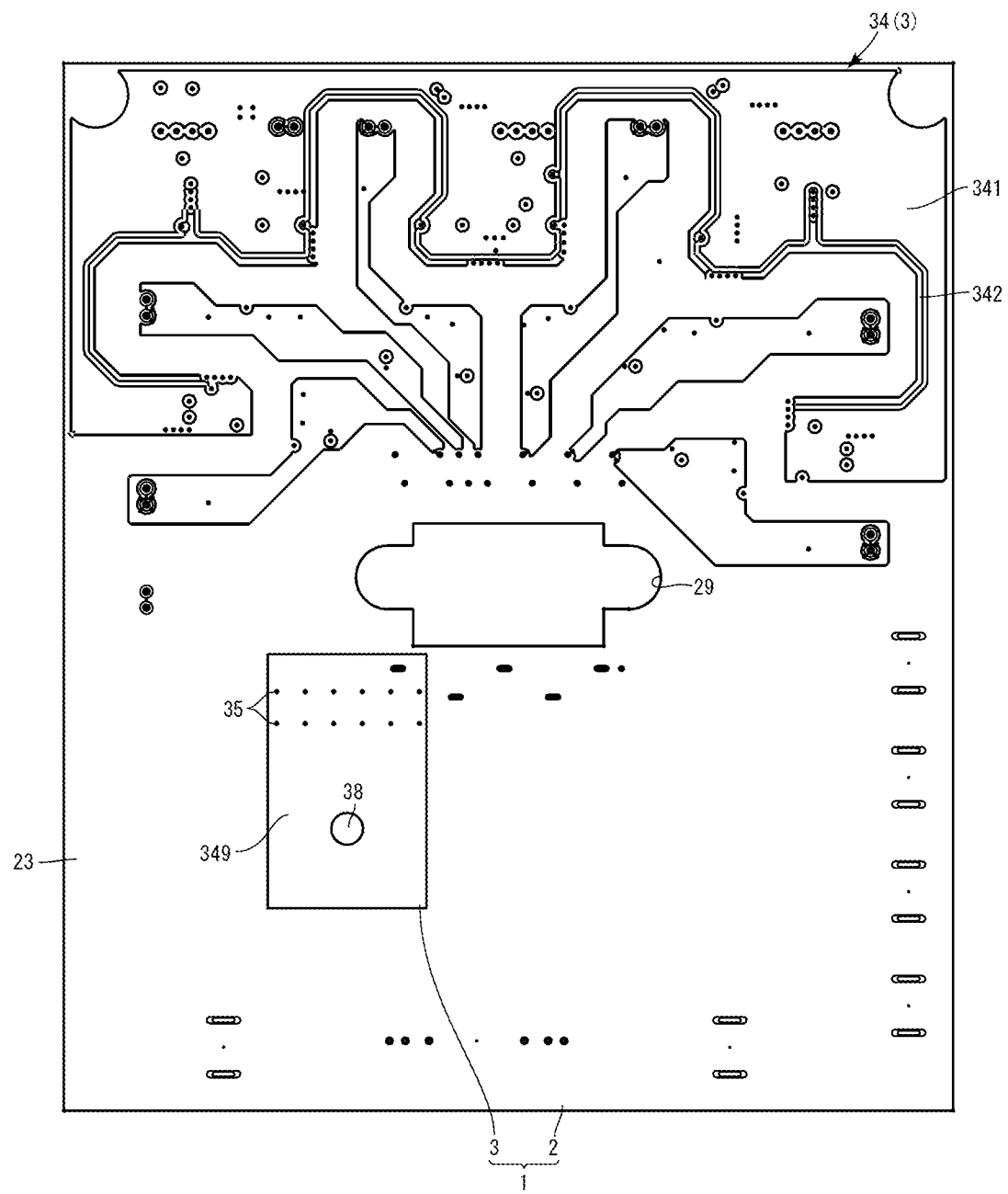
FIG. 5 is a plan view of a main portion showing the power conversion device according to the first embodiment of the present disclosure.
Figure 6:
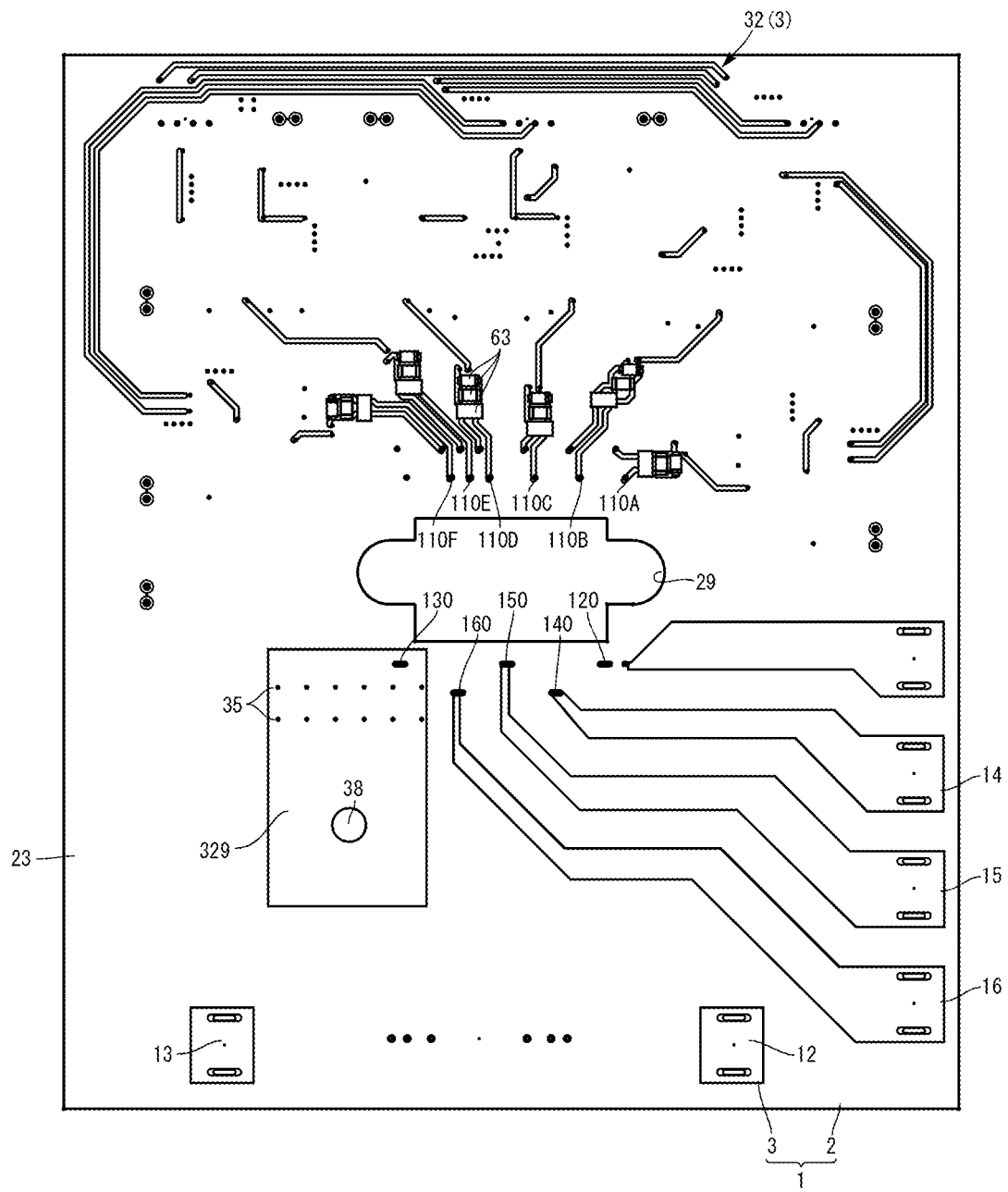
FIG. 6 is a plan view of a main portion showing the power conversion device according to the first embodiment of the present disclosure.
Figure 7:
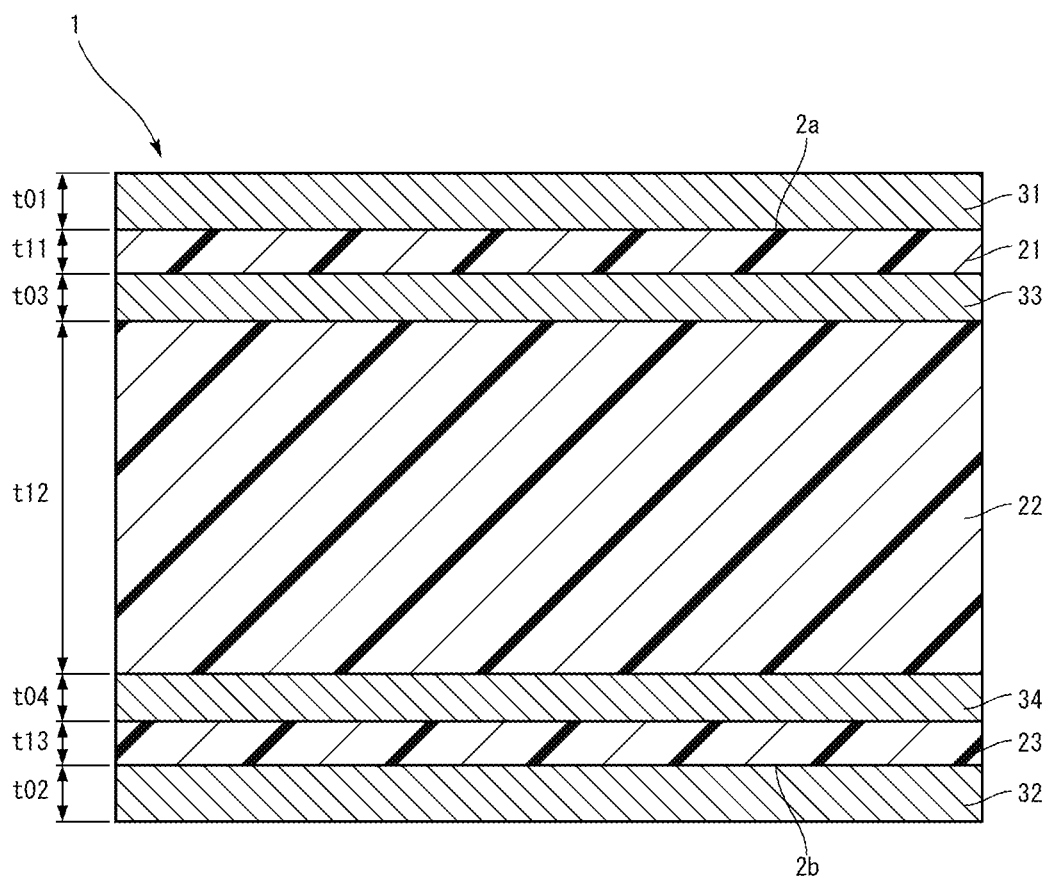
FIG. 7 is an enlarged cross-sectional view of a main portion showing a substrate of the power conversion device according to the first embodiment of the present disclosure.
Figure 7:
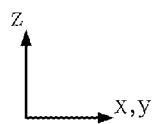
Figure 8:
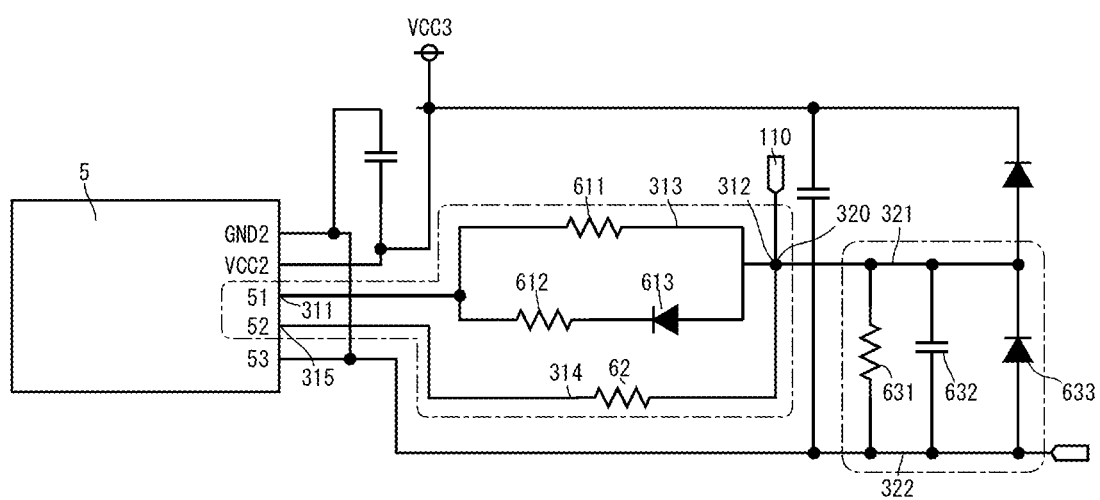
FIG. 8 is a diagram showing an example of a circuit configuration of the power conversion device according to the first embodiment of the present disclosure.
Figure 9:
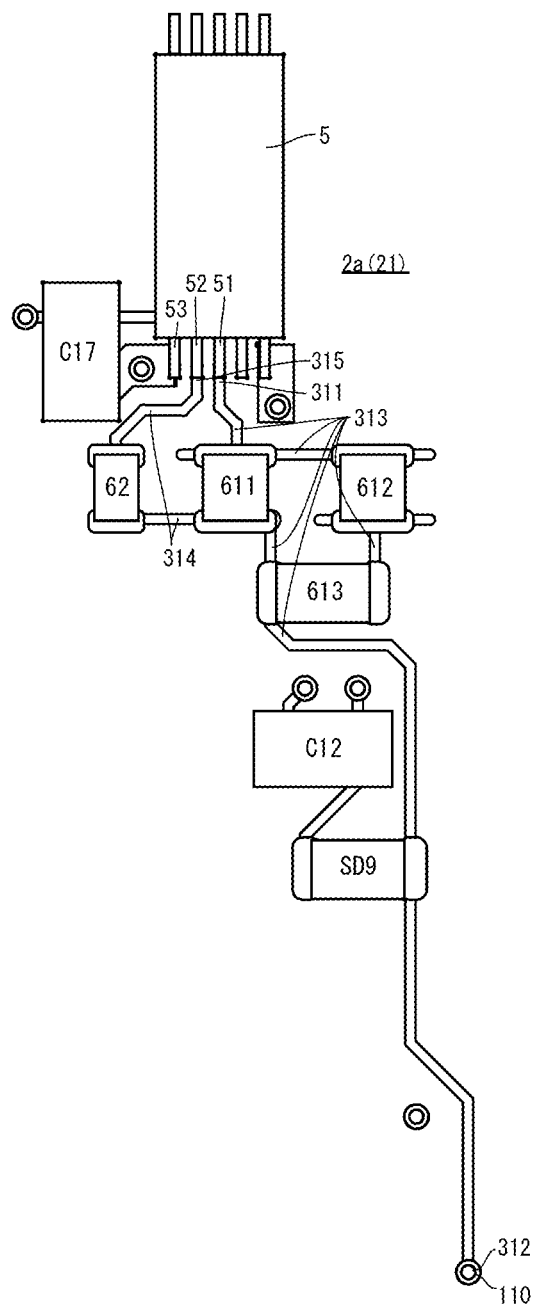
FIG. 9 is an enlarged plan view of a main portion showing the power conversion device according to the first embodiment of the present disclosure.
Figure 10:
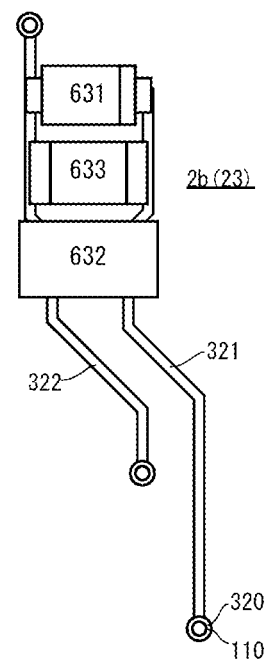
FIG. 10 is an enlarged plan view of a main portion showing a power conversion device according to the first embodiment of the present disclosure.
Figure 10:
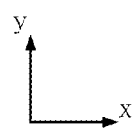
Figure 11:
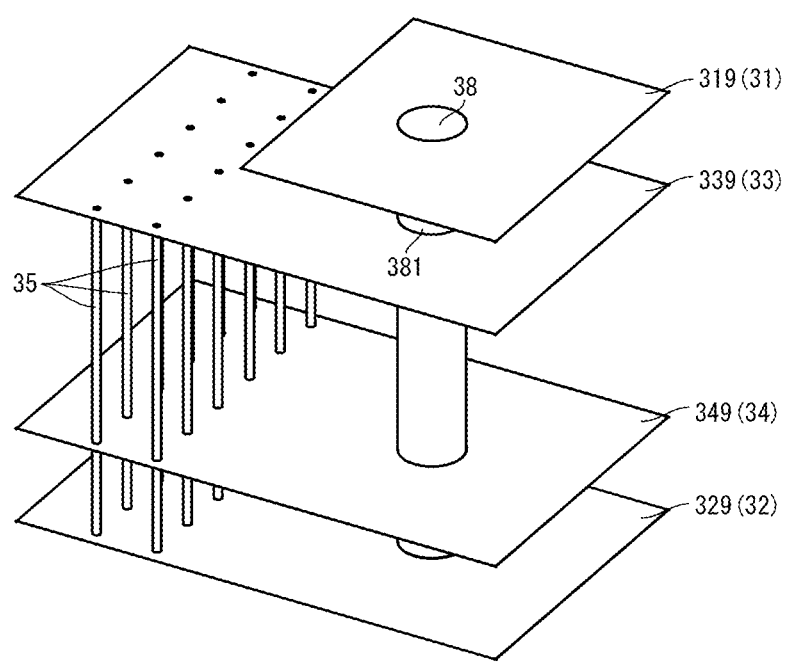
FIG. 11 is an enlarged perspective view of a main portion showing the power conversion device according to the first embodiment of the present disclosure.
Figure 12:
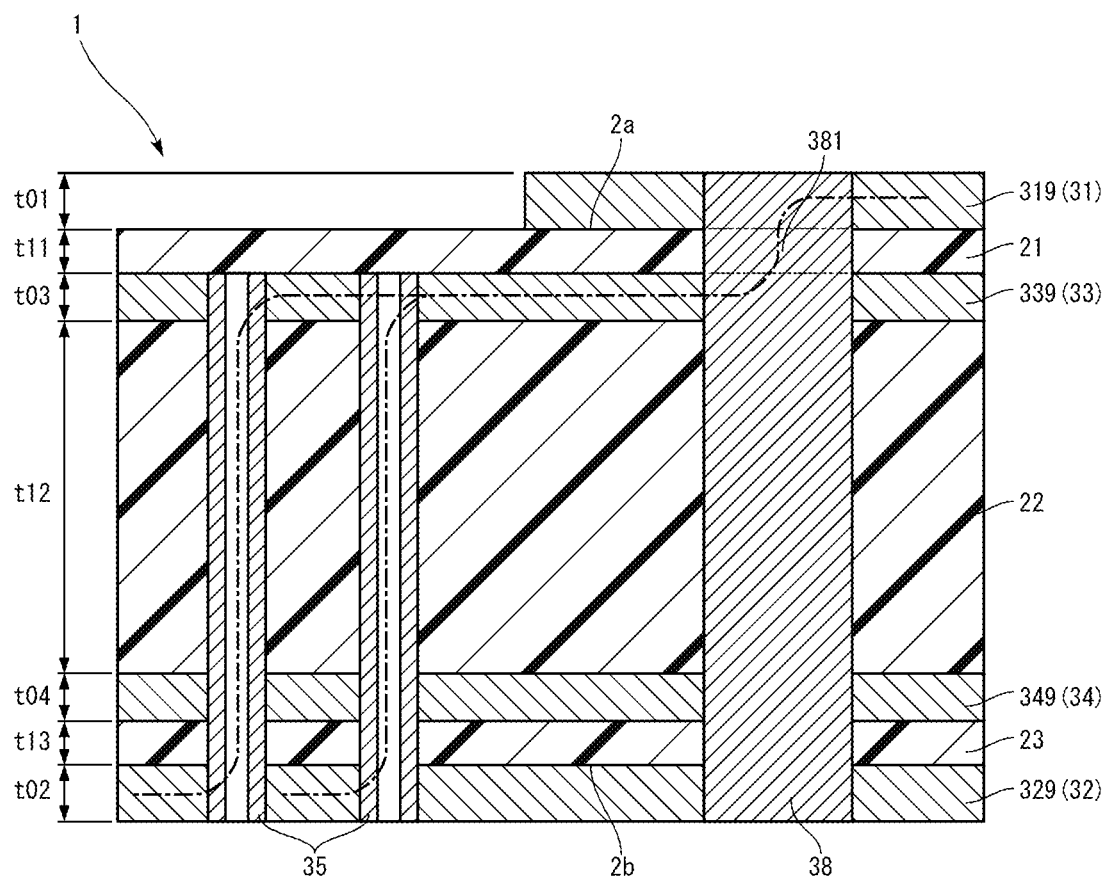
FIG. 12 is an enlarged cross-sectional view of a main portion showing the power conversion device according to the first embodiment of the present disclosure.
Figure 13:
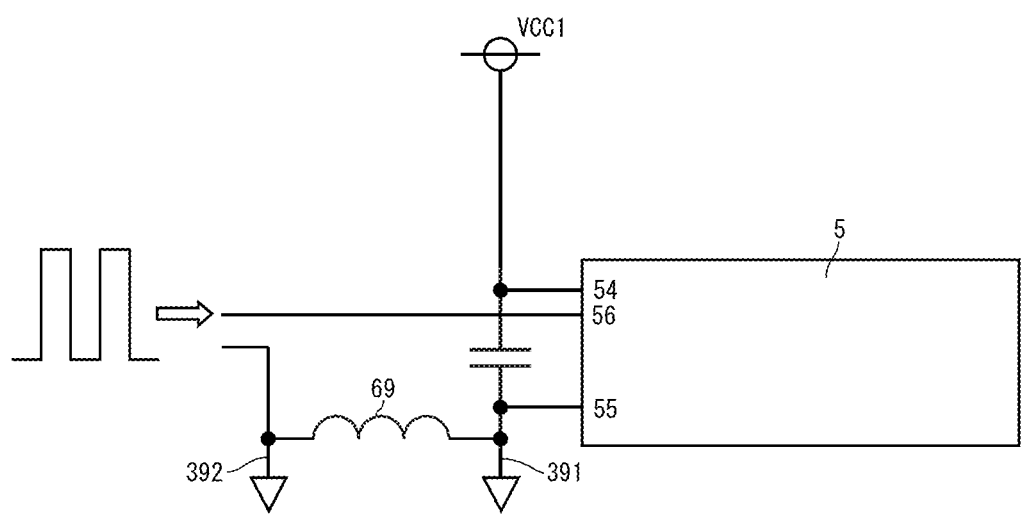
FIG. 13 is a diagram showing an example of a circuit configuration of the power conversion device according to the first embodiment of the present disclosure.

FIG. 1 is a plan view showing a power conversion device A1. FIG. 2 is a diagram showing an example of the circuit configuration of the power conversion device A1. FIG. 3 is a plan view of a main portion showing the power conversion device A1. FIG. 4 is a plan view of a main portion showing the power conversion device A1. FIG. 5 is a plan view of a main portion showing the power conversion device A1. FIG. 6 is a plan view of a main portion showing the power conversion device A1. FIG. 7 is an enlarged cross-sectional view of a main portion showing the substrate of the power conversion device A1. FIG. 8 is a diagram showing an example of the circuit configuration of the power conversion device A1. FIG. 9 is an enlarged plan view of a main portion showing the power conversion device A1. FIG. 10 is an enlarged plan view of a main portion showing the power conversion device A1. FIG. 11 is an enlarged perspective view of a main portion showing the power conversion device A1. FIG. 12 is an enlarged cross-sectional view of a main portion showing the power conversion device A1. FIG. 13 is a diagram showing an example of the circuit configuration of the power conversion device A1. Note that the z direction in the drawing corresponds to the thickness direction of the present disclosure. In FIG. 3, the power module 40 is omitted to facilitate comprehension. FIG. 4 shows a first intermediate conductive layer 33 and a second layer 22, which will be described later. FIG. 5 shows a second intermediate conductive layer 34 and a third layer 23, which will be described later. FIG. 6 shows a later-described reverse surface conductive layer 32 and the third layer 23 (reverse surface 2b) with the left and right directions on the sheet surface (x directions) reversed for facilitating comprehension.

<Power Module 40>

The power module 40 is a module that fulfills a switching function for realizing a power conversion function. As shown in FIGS. 1 and 2, the power module 40 of the present embodiment includes a plurality of switching elements 4, a plurality of gate terminals 41, a positive electrode-side input terminal 42, a negative electrode-side input terminal 43, output terminals 44, 45, and 46 and sealing resin 49.

The plurality of switching elements 4 exhibit a switching function for converting DC power input from the positive electrode-side input terminal 42 and the negative electrode-side input terminal 43 into the three-phase AC power to be output from the output terminals 44, 45, and 46. In the present embodiment, the power module 40 includes six switching elements 4A, 4B, 4C, 4D, 4E, and 4F. The switching elements 4A, 4B, and 4C form the upper arm of a half-bridge circuit, and the switching elements 4D, 4E, and 4F form the lower arm.

The specific configuration of the switching element 4 is not limited in any way, and in the present embodiment, a SiC-MOSFET, which is formed by using a semiconductor substrate material containing SiC as a main component, is adopted thereas. The switching element 4 has a gate electrode GP, a source electrode SP, and a drain electrode DP.

The plurality of gate terminals 41 are terminals that receive control signals (gate drive signals) input to the plurality of switching elements 4. In this embodiment, six gate terminals 41A, 41B, 41C, 41D, 41E, and 41F are provided corresponding to the six switching elements 4A, 4B, 4C, 4D, 4E, and 4F.

The sealing resin 49 covers the plurality of switching elements 4, and is made of an insulating resin such as a black epoxy resin. Also, the power module 40 may include a heat dissipating member (not shown) that is partially exposed from the sealing resin 49. This heat dissipating member is for dissipating heat from the plurality of switching elements 4 to the outside of the power module 40, and is in areal contact with or is bonded to, for example, a heat sink (not shown).

Note that the power conversion device of the present disclosure is not limited to the configuration in which the six switching elements 4A, 4B, 4C, 4D, 4E, and 4F are built in the power module 40, and for example, it is also possible to use a configuration in which the six switching elements 4A, 4B, 4C, 4D, 4E, and 4F are directly mounted individually on the substrate 1.

<Plurality of Gate Driver ICs 5>

The plurality of gate driver ICs 5 are ICs that perform drive control of the plurality of switching elements 4. In this embodiment, six gate driver ICs 5A, 5B, 5C, 5D, 5E, and 5F are provided corresponding to the six switching elements 4A, 4B, 4C, 4D, 4E, and 4F. Note that there is no limitation to a configuration in which the number of gate driver ICs 5 matches the number of switching elements 4, and for example, it is also possible to use a configuration including a gate driver IC 5 for the three switching elements 4A, 4B, and 4C constituting the upper arm and a gate driver IC 5 for the three switching elements 4D, 4E, and 4F forming the lower arm.

As shown in FIGS. 2, 8, and 13, the gate driver IC 5 of the present embodiment may include a control signal output terminal 51, a Miller clamp terminal 52, an output-side (secondary-side) ground terminal 53, an analog power source input terminal 54, an input-side (primary-side) ground terminal 55, and a digital signal input terminal 56, and may also include input terminals and output terminals other than these, as appropriate.

The control signal output terminal 51 is a terminal for outputting a control signal to be input to the gate electrode GP (gate terminal 41) of the switching element 4. The Miller clamp terminal 52 is a terminal for forming a Miller clamp circuit. The output-side (secondary-side) ground terminal 53 is a terminal connected to the ground. The analog power source input terminal 54 is an input terminal to which an analog power source is connected. The input-side (primary-side) ground terminal 55 is a terminal connected to the ground wiring of the analog power source. The digital signal input terminal 56 is a terminal to which a digital signal from a microcomputer or the like to which the power conversion device A1 is connected is input. Note that the drive circuit including the gate driver IC 5 preferably has a configuration in which the output-side (secondary-side) ground terminal 53 and the input-side (primary-side) ground terminal 55 are insulated from each other. Such a configuration may also be realized by using a transformer (not shown) provided outside the gate driver IC 5, or may have a configuration in which an isolation transformer structure is included inside the gate driver IC 5. In the present embodiment, an isolation transformer structure is included in the gate driver IC 5.

<Substrate 1>

The power module 40, the plurality of gate driver ICs 5, and the plurality of electronic components 6 are mounted on the substrate 1. The substrate 1 of the present embodiment has a base 2 and a conductive portion 3.

FIG. 7 shows a portion of the substrate 1. The base 2 has an obverse surface 2a and a reverse surface 2b. The obverse surface 2a and the reverse surface 2b are surfaces facing sides opposite to each other in the z direction. A first layer 21, a second layer 22, and a third layer 23 are included therein. The first layer 21, the second layer 22, and the third layer 23 are stacked on each other in the z direction in this order. One surface of the first layer 21 constitutes the obverse surface 2a. One surface of the second layer 22 constitutes the reverse surface 2b. The material of the base 2 (first layer 21, second layer 22, and third layer 23) is not limited in any way, and is made of an insulating material such as glass epoxy resin.

An opening 29 is formed in the base 2 of the present embodiment. The opening 29 penetrates through the base 2 (first layer 21, second layer 22, and third layer 23) in the z direction. The opening 29 is used, for example, to fix the power module 40 to the substrate 1 or a heat dissipating member (not shown) such as a heat sink.

The conductive portion 3 is supported by the base 2, and constitutes a conduction path for the power module 40, the plurality of gate driver ICs 5, and the plurality of electronic components 6. As shown in FIG. 7, the conductive portion 3 of the present embodiment has an obverse surface conductive layer 31, a reverse surface conductive layer 32, a first intermediate conductive layer 33, and a second intermediate conductive layer 34. The obverse surface conductive layer 31, the reverse surface conductive layer 32, the first intermediate conductive layer 33, and the second intermediate conductive layer 34 are made of, for example, a metal such as Cu, Ni, or Au, and are formed through, for example, plating.

The obverse surface conductive layer 31 is arranged on the obverse surface 2a. The reverse surface conductive layer 32 is arranged on the reverse surface 2b. The first intermediate conductive layer 33 is arranged between the obverse surface conductive layer 31 and the reverse surface conductive layer 32 in the z direction, and in the present embodiment, is interposed between the first layer 21 and the second layer 22. The second intermediate conductive layer 34 is arranged between the first intermediate conductive layer 33 and the reverse surface conductive layer 32 in the z direction, and in the present embodiment, is interposed between the second layer 22 and the third layer 23. Also, the conductive portion 3 has a plurality of through-out conductive portions 35. The through-out conductive portions 35 are conductive portions that penetrate through any or all of the first layer 21, the second layer 22, and the third layer 23, and penetrate through appropriate locations of the obverse surface conductive layer 31, the reverse surface conductive layer 32, the first intermediate conductive layer 33, and the second intermediate conductive layer 34.

The thickness relationship between the first layer 21, the second layer 22, the third layer 23, the obverse surface conductive layer 31, the reverse surface conductive layer 32, and the first intermediate conductive layer 33 is not limited in any way. To give an example of these thicknesses, the thickness t01 of the obverse surface conductive layer 31 is 50 μm to 123 μm, the thickness t02 of the reverse surface conductive layer 32 is 50 μm to 123 μm, the thickness t03 of the first intermediate conductive layer 33 is 50 μm to 107 μm, and the thickness t04 of the second intermediate conductive layer 34 is 50 μm to 107 μm. Also, the thickness t11 of the first layer 21 (distance between the obverse surface conductive layer 31 and the first intermediate conductive layer 33) is 90 μm to 200 μm, the thickness t12 of the second layer 22 (distance between the first intermediate conductive layer 33 and the second intermediate conductive layer 34) is 200 μm to 850 μm, and the thickness t13 of the third layer 23 (distance between the second intermediate conductive layer 34 and the reverse surface conductive layer 32) is 90 μm to 200 μm. Note that in a preferable example of the thickness relationship, the thickness t03 is less than the thickness t01 and the thickness t02. Also, the thickness t11 is less than the thicknesses t01 and t03. Also, the thickness t04 is less than the thickness t01 and the thickness t02. Also, the thickness t13 is less than the thickness t02 and the thickness t04. Also, the thickness t12 is greater than any of the thicknesses t01, t02, t03, t04, t11, and t13.

As shown in FIGS. 1 to 3, the substrate 1 of the present embodiment has a plurality of external power source terminals 10, a plurality of external control terminals 11, an external positive electrode-side input terminal 12, an external negative electrode-side input terminal 13, external output terminals 14, 15, and 16, a plurality of internal control terminals 110, an internal positive electrode-side input terminal 120, an internal negative electrode-side input terminal 130, and internal output terminals 140, 150, and 160.

The plurality of external power source terminals 10 are terminals connected to the control power source and the ground wire. The plurality of external control terminals 11 are terminals connected to, for example, a pulse signal generator, a microcomputer, or the like. In the illustrated example, regarding the plurality of external power source terminals 10 and external control terminals 11, the position close to one side in the y direction of the base 2 is arranged at a position that is close to both sides in that x direction and close to one side in the y direction of the base 2.

The external positive electrode-side input terminal 12 is a terminal that is to be connected to the positive electrode of the DC power source. The external negative electrode-side input terminal 13 is a terminal that is to be connected to the negative electrode of the DC power source. In the example shown in the drawings, the external positive electrode-side input terminal 12 and the external negative electrode-side input terminal 13 are arranged closer to the other side in the y direction of the base 2. The external output terminals 14, 15, and 16 are terminals that are to be respectively connected to, for example, a U phase, a V phase and a W phase of the motor, which are external loads. In the illustrated example, the external output terminals 14, 15, and 16 are arranged close to one side in the x direction of the base 2 and close to the other side in the y direction.

The plurality of internal control terminals 110 are terminals for transmitting a drive signal to the power module 40. In this embodiment, six internal control terminals 110A, 110B, 110C, 110D, 110E, and 110F are provided, and six gate terminals 41A, 41B, 41C, 41D, 41E, and 41F of the power module 40 are individually connected. In the example shown in the drawings, the six internal control terminals 110A, 110B, 110C, 110D, 110E, and 110F are arranged around the opening 29.

The internal positive electrode-side input terminal 120, the internal negative electrode-side input terminal 130, and the internal output terminals 140, 150, and 160 are terminals that are individually connected to the positive electrode-side input terminal 42, the negative electrode-side input terminal 43, and the output terminals 44, 45, and 46 of the power module 40. In the example shown in the drawing, the internal positive electrode-side input terminal 120, the internal negative electrode-side input terminal 130, and the internal output terminals 140, 150, and 160 are arranged in the surrounding area of the opening 29, and are arranged on the side opposite from the six internal control terminals 110A, 110B, 110C, 110D, 110E, and 110F with the opening 29 interposed therebetween in the y direction.

The obverse surface conductive layer 31 includes a plurality of wiring portions and the like on the obverse surface 2a, and forms a conductive path leading to the plurality of gate driver ICs 5, the plurality of electronic components 6, and the like. The obverse surface conductive layer 31 forms, for example, a conductive path between the external power source terminal 10 or the external control terminal 11 and the gate driver IC 5 or the electronic component 6, a conductive path connecting the external positive electrode-side input terminal 12 and the positive electrode-side input terminal 42, and the like. Also, as shown in FIGS. 8 and 9, the obverse surface conductive layer 31 of the present embodiment includes a first connection portion 311, a second connection portion 312, first wiring portions 313, second wiring portions 314, and a third connection portion 315.

In FIGS. 8 and 9, the elements related to one gate driver IC 5 are extracted and shown. Since the power conversion device A1 of the present embodiment has six gate driver ICs 5, six similar wiring configurations are provided. The first connection portion 311 is a portion that is connected to the control signal output terminal 51 of the gate driver IC 5. The second connection portion 312 is a portion that is connected to the gate electrode GP of the switching element 4, and in the present embodiment, the internal control terminal 110 that is connected to the gate terminal 41 of the power module 40 forms the second connection portion 312. The first wiring portions 313 are wiring portions interposed between the first connection portion 311 and the second connection portion 312. A conductive member that penetrates through the base 2 (all or any of the first layer 21, the second layer 22, and the third layer 23) in the z direction such as the through-out conductive portion 35 is not connected to the first wiring portion 313.

The third connection portion 315 is a portion that is to be connected to the Miller clamp terminal 52 of the gate driver IC 5. The second wiring portions 314 are wiring portions that are interposed between the third connection portion 315 and the second connection portion 312. A conductive member that penetrates the base 2 (all or any of the first layer 21, the second layer 22, and the third layer 23) in the z direction such as the through-out conductive portion 35 is not connected to the second wiring portions 314.

As shown in FIG. 6, the reverse surface conductive layer 32 includes a plurality of wiring portions and the like on the reverse surface 2b. The obverse surface conductive layer 31 forms, for example, a conductive path that individually connects the external output terminals 14, 15, and 16 and the internal output terminals 140, 150, and 160 to each other, and the like. Also, as shown in FIGS. 8 and 10, the reverse surface conductive layer 32 of the present embodiment includes the fourth connection portion 320, the third wiring portion 321, and the fourth wiring portion 322.

The fourth connection portion 320 is a portion connected to the second connection portion 312, and in the present embodiment, the fourth connection portion 320 is constituted by the internal control terminal 110 as well as the second connection portion 312. The third wiring portion 321 is a wiring portion that is electrically connected to the second connection portion 312 via the fourth connection portion 320. The fourth wiring portion 322 is a wiring portion connected to the ground.

The first intermediate conductive layer 33 is arranged between the first layer 21 and the second layer 22, and is electrically connected to the locations of the obverse surface conductive layer 31, the reverse surface conductive layer 32, and the second intermediate conductive layer 34 by the through-out conductive portion 35 as appropriate. As shown in FIG. 4, the first intermediate conductive layer 33 of the present embodiment has a first ground pattern portion 331. The first ground pattern portion 331 is a pattern portion connected to the ground, and is arranged close to one side of the base 2 in the y direction.

The second intermediate conductive layer 34 is arranged between the second layer 22 and the third layer 23, and is electrically connected to the positions of the obverse surface conductive layer 31, the reverse surface conductive layer 32, and the first intermediate conductive layer 33, by the through-out conductive portion 35 as appropriate. As shown in FIG. 5, the second intermediate conductive layer 34 of the present embodiment has a second ground pattern portion 341 and a power source pattern portion 342. The second ground pattern portion 341 is a pattern portion connected to the ground, and is arranged close to one side of the base 2 in the y direction. Most of the second ground pattern portion 341 overlaps with the first ground pattern portion 331 as viewed along the z direction. The power source pattern portion 342 is a portion connected to the power source, and in the example shown in the drawing, is a linear portion extending along the peripheral edge of the second ground pattern portion 341. The second ground pattern portion 341 overlaps with the first ground pattern portion 331 as viewed along the z direction.

Also, as shown in FIGS. 3 to 6, 10, and 11, in the present embodiment, the obverse surface conductive layer 31 has a first input pattern portion 319, the reverse surface conductive layer 32 has a second input pattern portion 329, the first intermediate conductive layer 33 has a third input pattern portion 339, and the second intermediate conductive layer 34 has a fourth input pattern portion 349. Also, the conductive portion 3 has a through-out conductive member 38 in addition to the plurality of through-out conductive portions 35.

The first input pattern portion 319 is connected to the external negative electrode-side input terminal 13. The second input pattern portion 329, the third input pattern portion 339, and the fourth input pattern portion 349 are connected to the internal negative electrode-side input terminal 130. The first input pattern portion 319, the second input pattern portion 329, the third input pattern portion 339, and the fourth input pattern portion 349 overlap each other as viewed along the z direction. Also, in the illustrated example, the second input pattern portion 329, the third input pattern portion 339, and the fourth input pattern portion 349 each have a substantially rectangular shape, and their mutual shapes and sizes and positions in the x direction and y direction are approximately the same. The first input pattern portion 319 has a smaller y-direction dimension than the second input pattern portion 329, the third input pattern portion 339, and the fourth input pattern portion 349.

Of the second input pattern portion 329, the third input pattern portion 339, and the fourth input pattern portion 349, the portions protruding from the first input pattern portion 319 as viewed along the z direction are connected to each other by a plurality of through-out conductive portions 35. The through-out conductive member 38 penetrates through the base 2 in the z direction, and connects the first input pattern portion 319, the second input pattern portion 329, the third input pattern portion 339, and the fourth input pattern portion 349 to each other. The specific configuration of the through-out conductive member 38 is not limited in any way, and may also be constituted by, for example, a screw. In the present embodiment, the electric resistance of the plurality of through-out conductive portions 35 is smaller than the electric resistance of the through-out conductive member 38. Also, the portion of the through-out conductive member 38 that is sandwiched between the first input pattern portion 319 and the third input pattern portion 339 constitutes a shunt resistor portion 381.

<Plurality of Electronic Components 6>

The plurality of electronic components 6 are electronic components for causing the power conversion device A1 to function, such as resistors, capacitors, diodes, coil components, and the like. In the present embodiment, the plurality of electronic components 6 include a plurality of obverse surface-side first electronic components 61, a plurality of obverse surface-side second electronic components 62, and a plurality of reverse surface-side electronic components 63. As shown in FIG. 1, the plurality of obverse surface-side first electronic components 61 and the plurality of obverse surface-side second electronic components 62 are mounted on the obverse surface 2a side of the base 2. As shown in FIG. 6, the plurality of reverse surface-side electronic components 63 are mounted on the reverse surface 2b side of the base 2.

As shown in FIGS. 8 and 9, the plurality of obverse surface-side first electronic components 61 include an obverse surface-side first electronic component 611, an obverse surface-side first electronic component 612, and an obverse surface-side first electronic component 613. The obverse surface-side first electronic components 611, the obverse surface-side first electronic components 612, and the obverse surface-side first electronic components 613 form circuit portions that connect the first connection portion 311 and the second connection portion 312 together with the first wiring portion 313. In the example shown in the drawing, the obverse surface-side first electronic component 611 is a resistor interposed between the first connection portion 311 and the second connection portion 312. The obverse surface-side first electronic component 612 and the obverse surface-side first electronic component 613 are connected in parallel to the obverse surface-side first electronic component 611 and are connected in series with each other. The obverse surface-side first electronic component 612 is, for example, a resistor, and the obverse surface-side first electronic component 613 is, for example, a Schottky barrier diode.

As shown in FIGS. 8 and 9, the obverse surface-side second electronic component 62 forms a circuit portion connecting the third connection portion 315 and the second connection portion 312 together with the second wiring portion 314. The obverse surface-side second electronic component 62 is, for example, a resistor.

As shown in FIGS. 8 and 10, the plurality of reverse surface-side electronic components 63 are electrically connected to the third wiring portion 321 and the fourth wiring portion 322. In the example shown in the drawings, the plurality of reverse surface-side electronic components 63 include a reverse surface-side electronic component 631, a reverse surface-side electronic component 632, and a reverse surface-side electronic component 633. The reverse surface-side electronic component 631, the reverse surface-side electronic component 632, and the reverse surface-side electronic component 633 are connected in parallel to each other. The reverse surface-side electronic component 631 is, for example, a resistor. The reverse surface-side electronic component 632 is, for example, a capacitor. The reverse surface-side electronic component 633 is, for example, a Schottky barrier diode.

Also, the present embodiment has the circuit configuration shown in FIG. 13. That is, the conductive portion 3 has an analog ground wiring portion 391 and a digital ground wiring portion 392 shown in FIGS. 1 and 13. The analog ground wiring portion 391 is connected to a ground terminal. The digital ground wiring portion 392 is a wiring portion that forms a ground for the digital signal input to the digital signal input terminal 56. The analog ground wiring portion 391 and the digital ground wiring portion 392 are connected by a coil component 69 shown in FIGS. 1 and 13.

Next, operations of the power conversion device A1 will be described.

According to the present embodiment, as shown in FIGS. 8 and 9, a conductive member penetrating in the z direction is not connected to the first wiring portion 313 interposed between the first connection portion 311 and the second connection portion 312. For this reason, it is possible to reduce the inductance of the path by which the control signal (drive signal) from the control signal output terminal 51 of the gate driver IC 5 is input to the gate electrode GP of the switching element 4. This makes it possible to achieve an increase in the speed of drive control (an increase in the frequency of the drive signal) of the switching element 4. As a result, in contrast to the practical range of the drive frequency according to the conventional technique being at most several tens of kHz, according to the present embodiment, the drive frequency can be increased from several tens of kHz to several hundred kHz, and a change of several A/ns or several tens of V/ns is possible as the change over time in the current and voltage.

Also, as shown in FIGS. 8 and 9, a conductive member penetrating in the z direction is not connected to the second wiring portion 314 interposed between the first connection portion 311 and the second connection portion 312. For this reason, it is possible to reduce the inductance of the Miller clamp circuit. This makes it possible to achieve an increase in the speed of drive control (an increase in the frequency of the drive signal) of the switching element 4.

As shown in FIGS. 8 and 10, the reverse surface-side electronic components 631, 632, and 633 form a protection circuit. Although these reverse surface-side electronic components 631, 632, and 633 are electrically connected to the second connection portion 312, they do not need to be arranged electrically between the first connection portion 311 and the second connection portion 312, or between the third connection portion 315 and the second connection portion 312. For this reason, it is possible to reduce the inductance of the conductive path between the first connection portion 311 and third connection portion 315 and the second connection portion 312 while achieving appropriate protection by connecting the reverse surface-side electronic components 631, 632, and 633 to the third wiring portion 321 and the fourth wiring portion 322 on the reverse surface 2b side without directly connecting them to the first wiring portion 313 and the second wiring portion 314.

As shown in FIG. 7, the thickness t11 of the first layer 21 (distance between the obverse surface conductive layer 31 and the first intermediate conductive layer 33) is smaller than the thickness t01 of the obverse surface conductive layer 31 and the thickness t03 of the first intermediate conductive layer 33. This makes it possible to reduce the inductance of the conductive path constituted by the obverse surface conductive layer 31, the first intermediate conductive layer 33, and the through-out conductive portion 35, which is preferable for increasing the speed of drive control (increasing the frequency of the drive signal) of the switching element 4.

Also, the thickness t13 of the third layer 23 (distance between the reverse surface conductive layer 32 and the second intermediate conductive layer 34) is smaller than the thickness t02 of the reverse surface conductive layer 32 and the thickness t04 of the second intermediate conductive layer 34. This makes it possible to reduce the inductance of the conductive path constituted by the reverse surface conductive layer 32, the second intermediate conductive layer 34, and the through-out conductive portion 35, which is preferable for increasing the speed of the drive control (increasing the frequency of the drive signal) of the switching element 4.

The first ground pattern portion 331 shown in FIG. 4 and the power source pattern portion 342 shown in FIG. 5 are portions where the potentials are significantly different from each other and the potential difference is remarkably large, and they overlap each other as viewed along the z direction. However, the thickness t12 of the second layer 22 is larger than any of the thicknesses t01, t02, t03, t04, t11, and t13. This makes it possible to suppress a case in which the first ground pattern portion 331, the power source pattern portion 342, and the second layer 22 form an electrical structure similar to a capacitor and unintentionally have an electrostatic capacitance.

As shown in FIGS. 3 to 6, 10, and 11, the conductive path between the external positive electrode-side input terminal 12 and the external negative electrode-side input terminal 13 is constituted by the first input pattern portion 319, the second input pattern portion 329, the third input pattern portion 339, the fourth input pattern portion 349, the plurality of through-out conductive portions 35, and the through-out conductive member 38. The plurality of through-out conductive portions 35 connect the third input pattern portion 339, the fourth input pattern portion 349, and the second input pattern portion 329 to each other and have a smaller electric resistance than the through-out conductive member 38. As a result, between the second input pattern portion 329 and the third input pattern portion 339, the plurality of through conducting portions 35 serve as the main conductive paths for the current, and the current flowing through the through-out conductive member 38 can be suppressed. Then, between the first input pattern portion 319 and the third input pattern portion 339, only the shunt resistor portion 381 formed by a portion of the through-out conductive member 38 serves as a conductive path. As a result, it is possible to more accurately measure the value of the current flowing through the external positive electrode-side input terminal 12 and the external negative electrode-side input terminal 13 by using the shunt resistor portion 381.

As shown in FIG. 13, the analog ground wiring portion 391 and the digital ground wiring portion 392 are connected to each other via a coil component 69. As a result, a high-frequency noise component that may be present in the digital ground wiring portion 392 can be blocked by the coil component 69, and the potential of the analog ground wiring portion 391 can be further stabilized.

Second Embodiment

Figure 14:
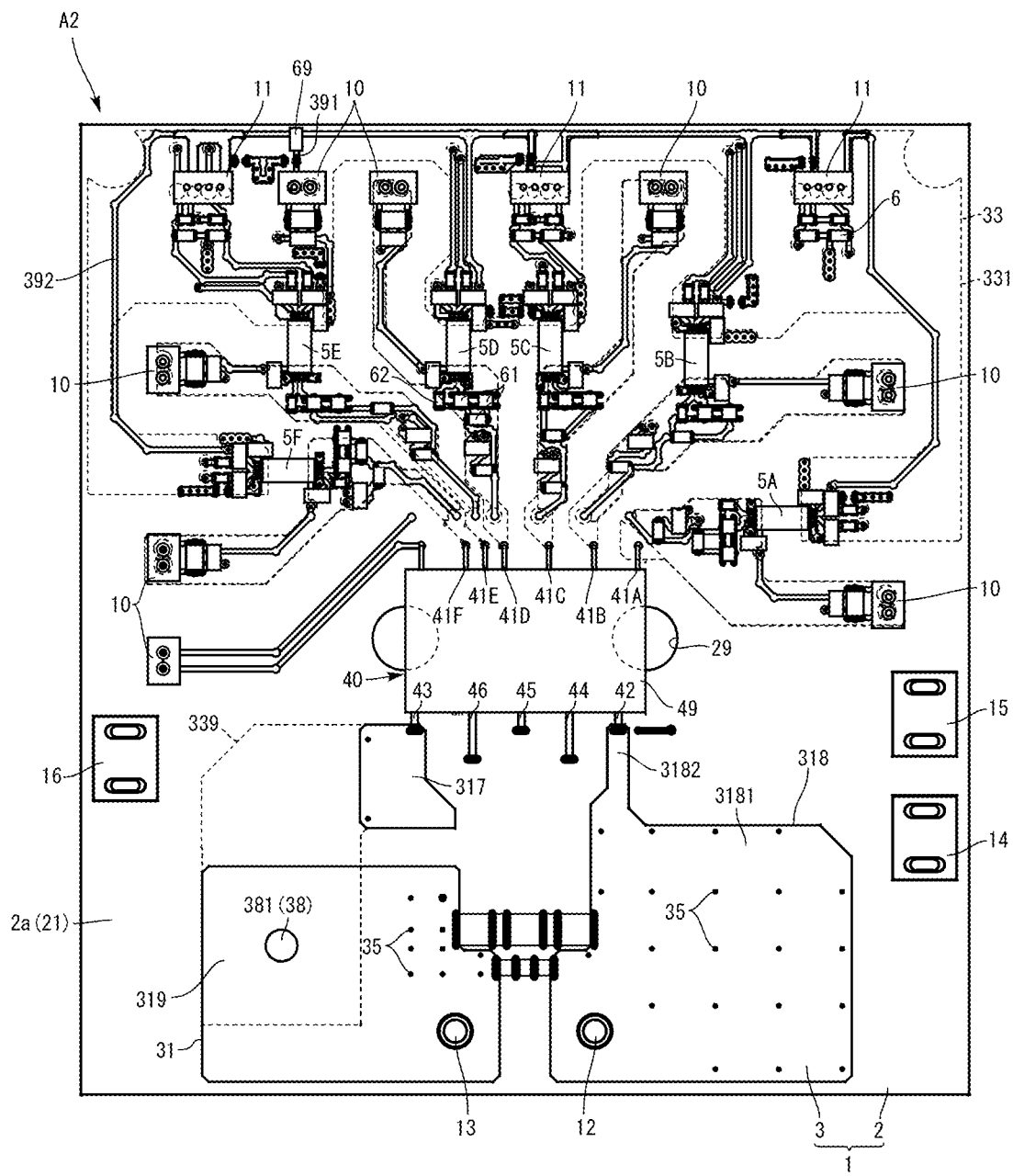
FIG. 14 is a plan view showing a power conversion device according to a second embodiment of the present disclosure.
Figure 15:
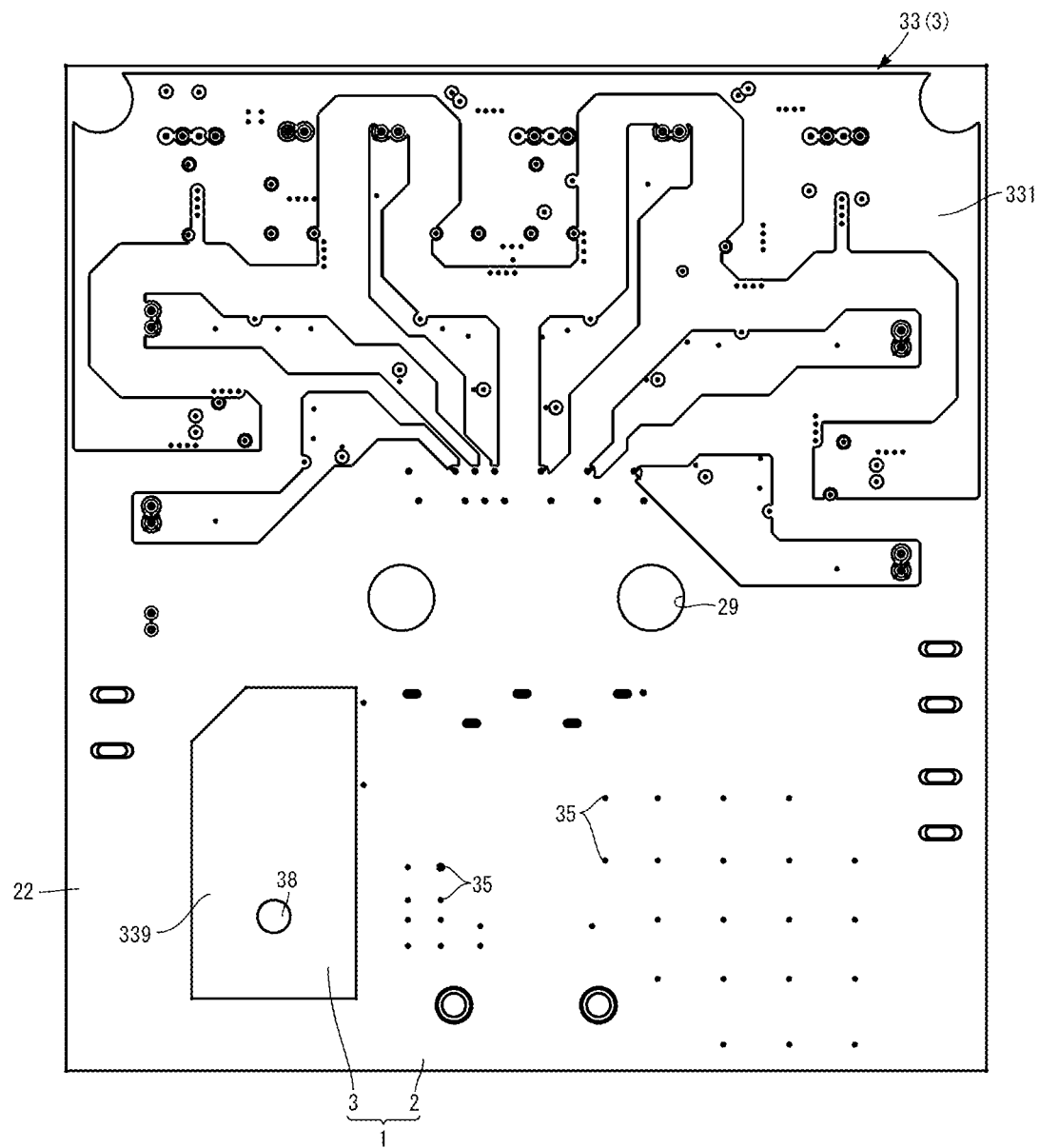
FIG. 15 is a plan view of a main portion showing the power conversion device according to the second embodiment of the present disclosure.
Figure 16:
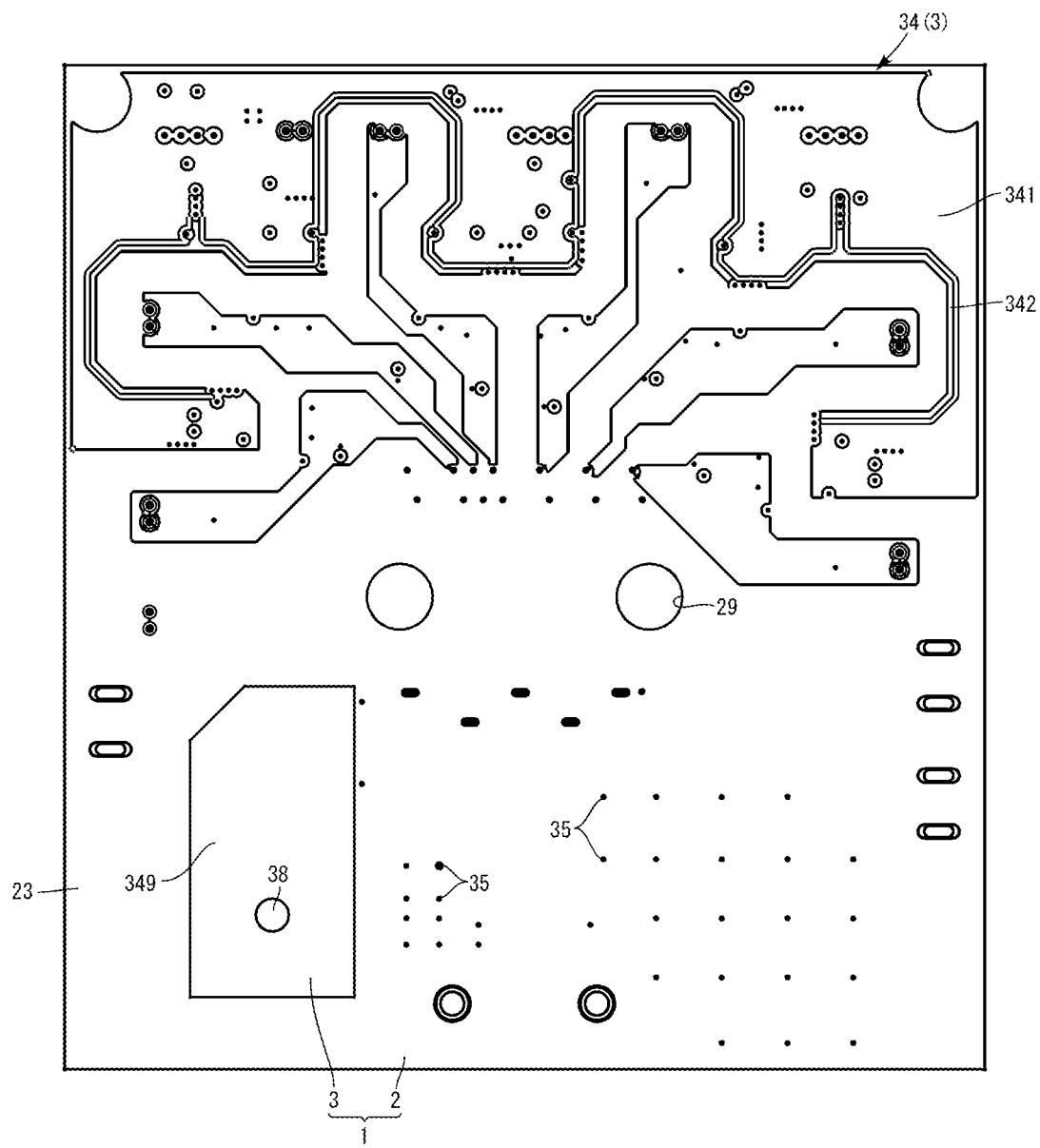
FIG. 16 is a plan view of a main portion showing the power conversion device according to the second embodiment of the present disclosure.
Figure 17:
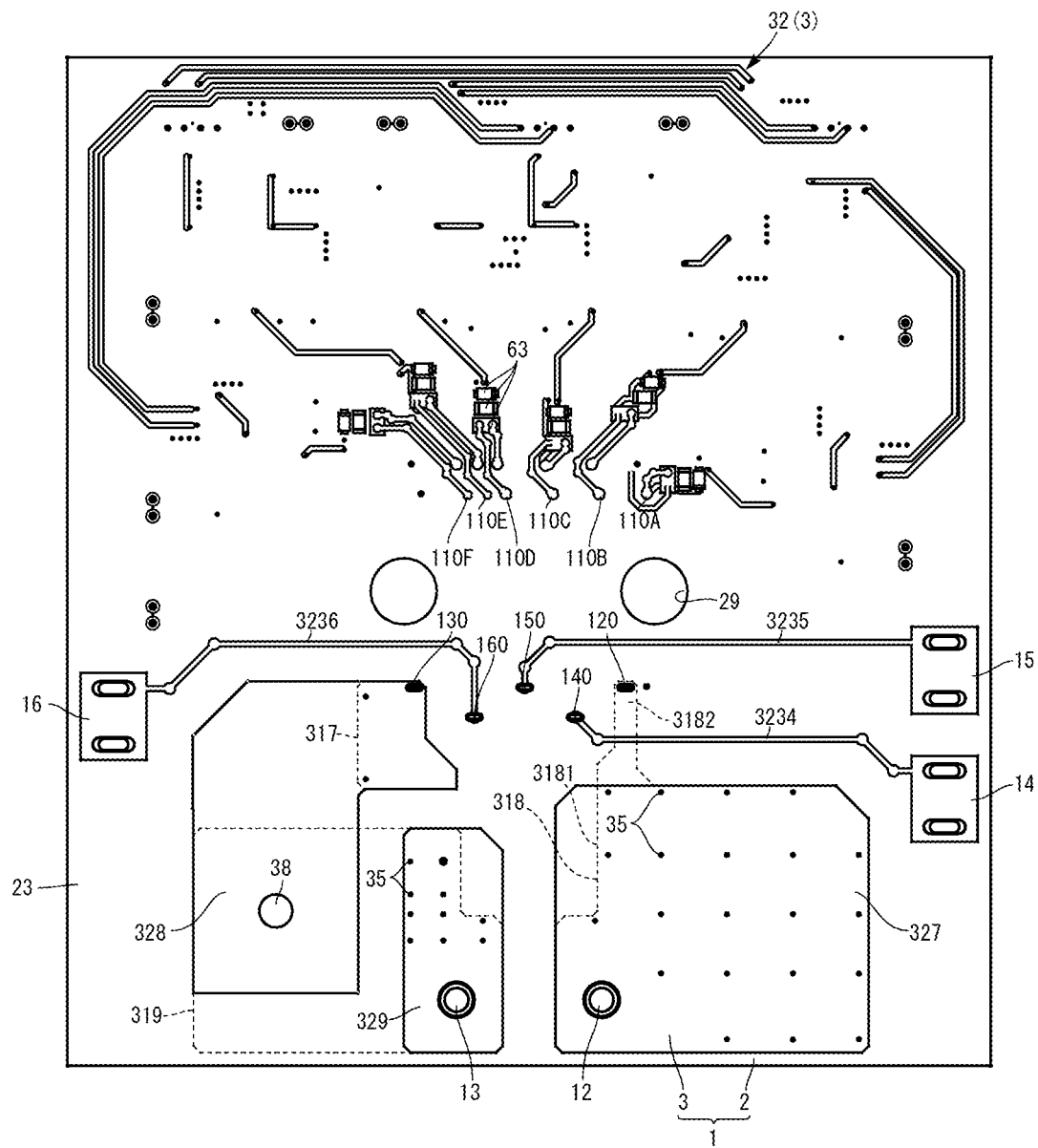
FIG. 17 is a plan view of a main portion showing the power conversion device according to the second embodiment of the present disclosure.

FIGS. 14 to 17 show the power conversion device A2 according to the second embodiment of the present disclosure. FIG. 14 is a plan view showing the power conversion device A2. FIGS. 15 to 17 are plan views of main portions showing the power conversion device A2. Similar to FIG. 6, FIG. 17 shows the left-right direction on the paper surface (x direction) reversed to facilitate comprehension.

The power conversion device A2 of the present embodiment is different from the power conversion device A1 in the configuration or arrangement of the external positive electrode-side input terminal 12, the external negative electrode-side input terminal 13, and the external output terminals 14, 15, and 16.

In the present embodiment, the external positive electrode-side input terminal 12 and the external negative electrode-side input terminal 13 are configured to include a through hole provided at the end on the other side (lower end in the drawing in FIG. 14) of the base 2 in the y direction. The shape of the through hole is not limited in any way, and in the example shown in the drawing, it is circular.

The external output terminal 14 and the external output terminal 15 are arranged close to one side of the base 2 in the x direction and close to the other side in the y direction. The external output terminal 16 is arranged close to the other side of the base 2 in the x direction and close to the other side in the y direction. That is, in the present embodiment, the external output terminal 14, the external output terminal 15, and the external output terminal 16 are arranged separately in the x direction.

The opening 29 of the base 2 has a shape different from that of the opening 29 in the power conversion device A1. The opening 29 of the present embodiment is constituted by two circular through holes.

Also, in the present embodiment, the configurations of the obverse surface conductive layer 31, the reverse surface conductive layer 32, the first intermediate conductive layer 33, and the second intermediate conductive layer 34 of the conductive portion 3 are different from those in the above-described embodiment due to differences in the configuration or arrangement of the external positive electrode-side input terminal 12, the external negative electrode-side input terminal 13, and the external output terminals 14, 15, and 16, and other purposes.

As shown in FIG. 14, the obverse surface conductive layer 31 has a relay pattern portion 317, a fifth input pattern portion 318, and a first input pattern portion 319.

The relay pattern portion 317 is connected to the internal negative electrode-side input terminal 130 and is electrically connected to the negative electrode-side input terminal 43 of the switching element 4. The relay pattern portion 317 is arranged on the one side in the y direction with respect to the first input pattern portion 319. The relay pattern portion 317 and the first input pattern portion 319 are arranged separated by a gap extending in the x direction. The relay pattern portion 317 has a smaller dimension in the x direction than the first input pattern portion 319. The relay pattern portion 317 has a smaller dimension in the y direction than the first input pattern portion 319. The area of the relay pattern portion 317 is smaller than that of the first input pattern portion 319.

The fifth input pattern portion 318 is a portion connected to the external positive electrode-side input terminal 12. The fifth input pattern portion 318 is arranged on one side in the x direction with respect to the first input pattern portion 319. The fifth input pattern portion 318 has a wide portion 3181 and a narrow portion 3182. The wide portion 3181 is a portion having a wide width in the x direction and is connected to the external positive electrode-side input terminal 12. The narrow portion 3182 is a portion that is narrower in the x direction than the wide portion 3181. The narrow portion 3182 extends from the wide portion 3181 to one side in the y direction. The narrow portion 3182 is connected to the internal positive electrode-side input terminal 120 and is electrically connected to the positive electrode-side input terminal 42 of the switching element 4.

As shown in FIG. 17, the reverse surface conductive layer 32 has a sixth input pattern portion 327, a relay pattern portion 328, a second input pattern portion 329, and wiring portions 3234, 3235, and 3236.

The relay pattern portion 328 is electrically connected to the relay pattern portion 317 of the obverse surface conductive layer 31 via the through-out conductive portion 35. The relay pattern portion 328 is electrically connected to the through-out conductive member 38. As a result, the relay pattern portion 328 is electrically connected to the first input pattern portion 319 via the through-out conductive member 38.

The second input pattern portion 329 is connected to the external negative electrode-side input terminal 13. The second input pattern portion 329 is electrically connected to the first input pattern portion 319 via a plurality of through-out conductive portions 35.

The sixth input pattern portion 327 is connected to the external positive electrode-side input terminal 12, and is arranged on one side in the x direction with respect to the second input pattern portion 329. Most of the sixth input pattern portion 327 is provided in a shape, size, and position that overlap with the wide portion 3181 of the fifth input pattern portion 318 of the obverse surface conductive layer 31 as viewed along the z direction.

The wiring portion 3234 is connected to the external output terminal 14 and the internal output terminal 140. The wiring portion 3234 has a shape with a narrow width in the direction perpendicular to a current application path. The wiring portion 3234 intersects the narrow portion 3182 of the fifth input pattern portion 318 of the obverse surface conductive layer 31 and is separated from the wide portion 3181 as viewed along the z direction. Also, the wiring portion 3234 is separated from the sixth input pattern portion 327.

The wiring portion 3235 is connected to the external output terminal 15 and the internal output terminal 150. The wiring portion 3235 has a shape with a narrow width in the direction perpendicular to the current application path. The wiring portion 3235 does not overlap with the fifth input pattern portion 318 as viewed along the z direction.

The wiring portion 3236 is connected to the external output terminal 16 and the internal output terminal 160. The wiring portion 3236 has a shape with a narrow width in the direction perpendicular to the current application path. The wiring portion 3236 does not overlap with the relay pattern portion 317 as viewed along the z direction.

As shown in FIG. 15, the first intermediate conductive layer 33 has a third input pattern portion 339. The third input pattern portion 339 is connected to the through-out conductive member 38.

As shown in FIG. 16, the second intermediate conductive layer 34 has a fourth input pattern portion 349. The fourth input pattern portion 349 is connected to the through-out conductive member 38.

In this embodiment as well, the through-out conductive member 38 forms the shunt resistor portion 381.

It is possible to achieve an increase in the speed of drive control using the present embodiment as well. Also, as shown in FIGS. 14 and 17, a path including the through-out conductive member 38 is formed between the internal negative electrode-side input terminal 130 and the external negative electrode-side input terminal 13. As a result, as described with reference to the power conversion device A1, it is possible to measure the current value using the shunt resistor portion 381.

Figure 18:
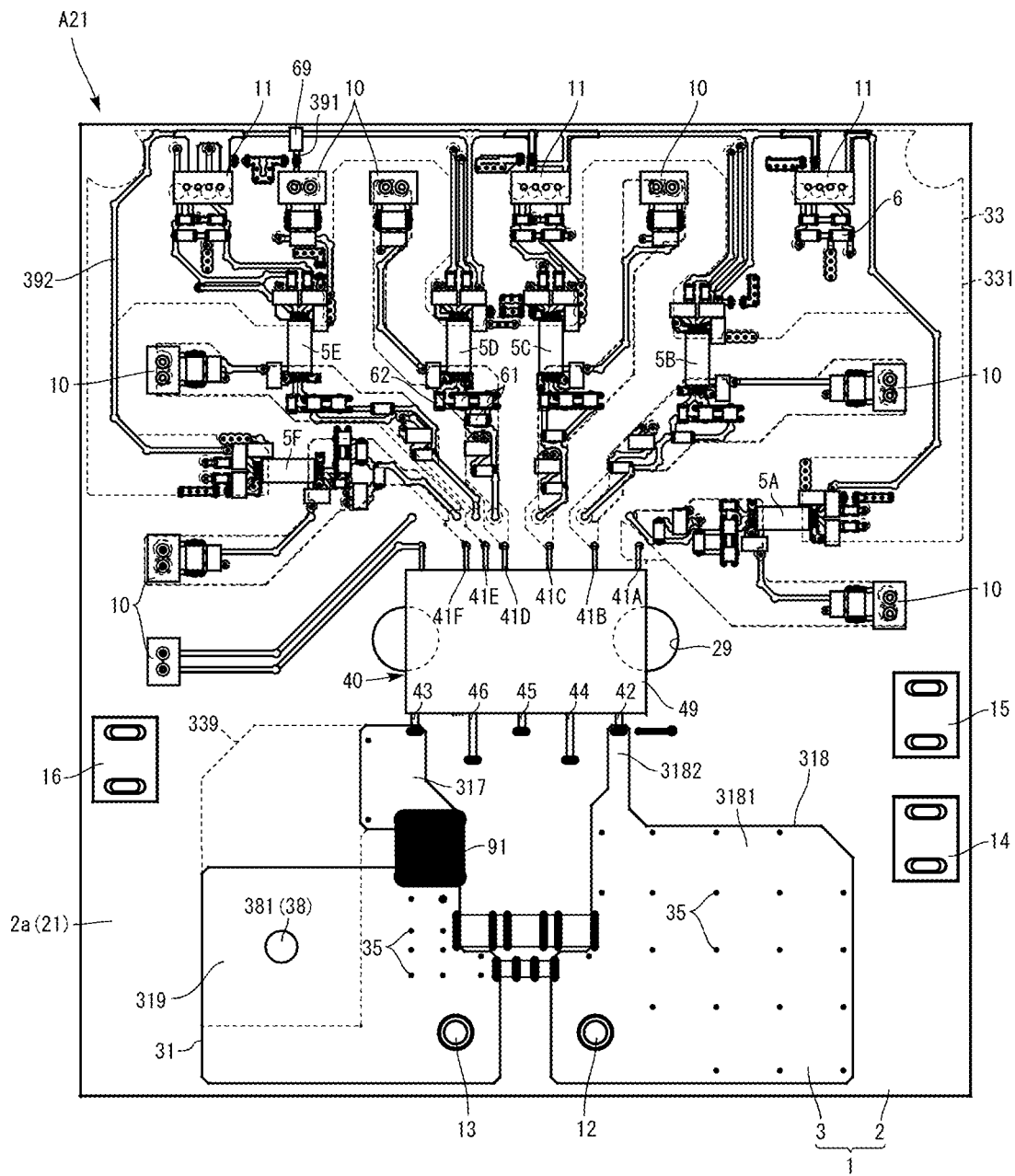
FIG. 18 is a plan view showing a first variation of the power conversion device according to the second embodiment of the present disclosure.

Also, in the present embodiment, the relay pattern portion 317 connected to the internal negative electrode-side input terminal 130 and the first input pattern portion 319 connected to the external negative electrode-side input terminal 13 are arranged separated by a gap. For example, in the power conversion device A21 serving as the first variation shown in FIG. 18, the relay pattern portion 317 and the first input pattern portion 319 are electrically connected and joined together by solder 91. As a result, the path between the internal negative electrode-side input terminal 130 (negative electrode-side input terminal 43) and the external negative electrode-side input terminal 13 has a configuration in which the path including the shunt resistor portion 381 and the path including the solder 91 are connected in parallel to each other. Generally, the resistance value of the solder 91 is smaller than the resistance value of the shunt resistor portion 381. For this reason, due to the solder 91, a circuit that bypasses the shunt resistor portion 381 is formed. This makes it possible to achieve an even lower resistance and lower inductance of the current path when the user of the power conversion device A21 does not use the shunt resistor portion 381.

Figure 19:
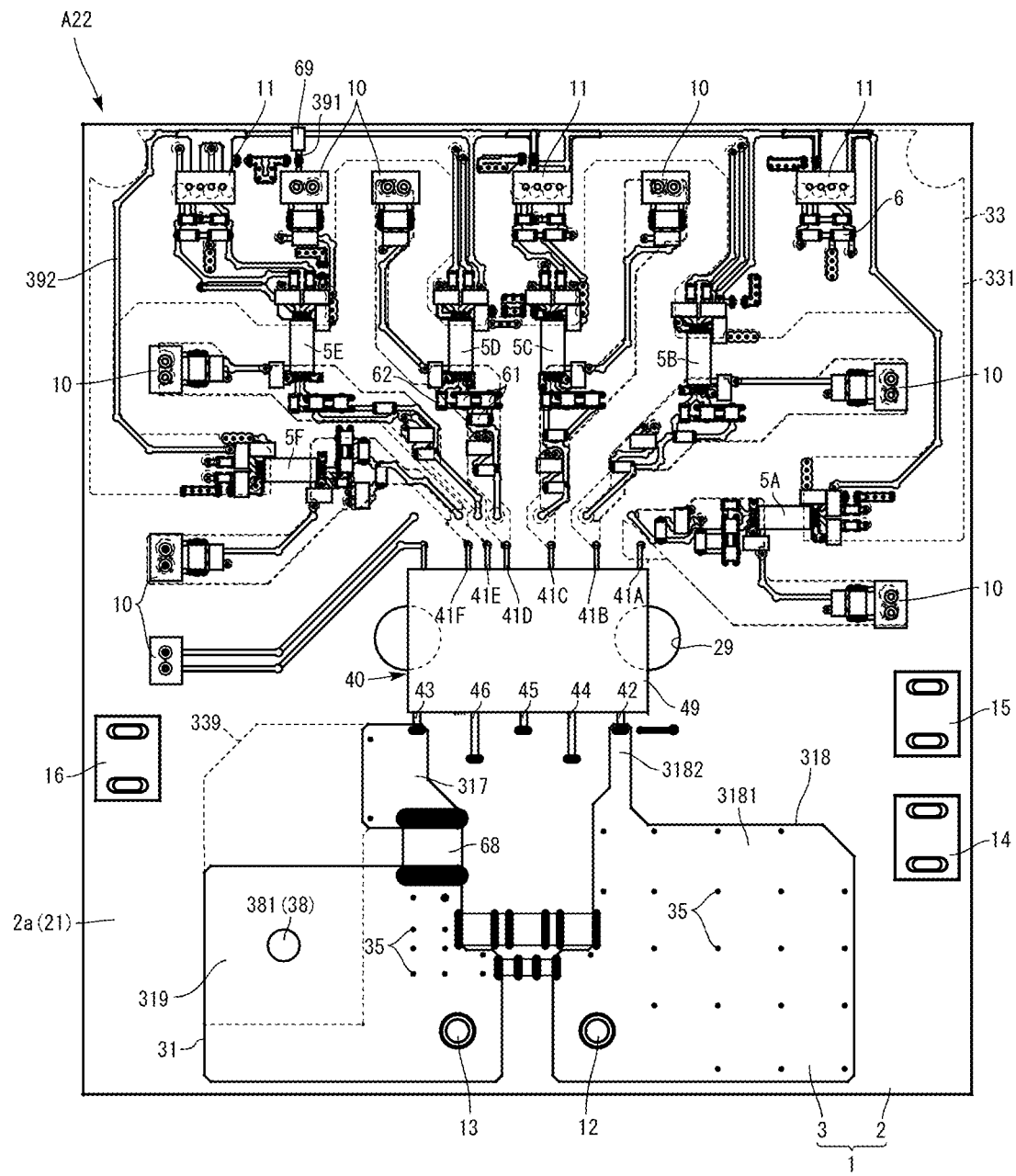
FIG. 19 is a plan view showing a second variation of the power conversion device according to the second embodiment of the present disclosure.

Also, in a power conversion device A22 serving as a second variation shown in FIG. 19, a shunt resistor 68 is connected to the relay pattern portion 317 and the first input pattern portion 319. As a result, the path between the internal negative electrode-side input terminal 130 (negative electrode-side input terminal 43) and the external negative electrode-side input terminal 13 has a configuration in which the path including the shunt resistor portion 381 and the path including the shunt resistor 68 are connected in parallel to each other. By setting the specifications such as the resistance value of the shunt resistor 68 as appropriate, it is possible to measure the current value under different conditions from those of the measurement of the current value using only the shunt resistor portion 381.

As shown in FIG. 17, the wiring portion 3234 intersects the narrow portion 3182 as viewed along the z direction. Both the wiring portion 3234 and the narrow portion 3182 are formed as narrow portions. As a result, it is possible to reduce the parasitic capacitance caused by the wiring portion 3234 and the narrow portion 3182 overlapping. Accordingly, the operating characteristics of the power conversion device A2 can be further improved.

By arranging the external output terminal 16 on the side opposite from the external output terminal 14 and the external output terminal 15 in the x direction, it is possible to avoid a case in which the wiring portion 3236 overlaps with the relay pattern portion 317 and the fifth input pattern portion 318 as viewed along the z direction. Also, by arranging the external output terminal 15 toward the one side in the y direction relative to the external output terminal 14, it is possible to avoid a case in which the wiring portion 3235 overlaps with the fifth input pattern portion 318 as viewed along the z direction. These also make it possible to further increase the operating characteristics of the power conversion device A2.

The power conversion device according to the present disclosure is not limited to the above-described embodiment. The specific configuration of each portion of the power conversion device according to the present disclosure can be freely designed in various ways.

Clause 1.
A power conversion device including:
a plurality of switching elements that each have a gate electrode, a source electrode, and a drain electrode;
a plurality of gate driver ICs configured to perform drive control of the plurality of switching elements, respectively; and
a substrate on which the plurality of gate driver ICs are mounted,
wherein the substrate includes: an insulating base having an obverse surface and a reverse surface that face mutually opposite sides in a thickness direction; and a conductive portion that is supported by the base,
the conductive portion includes an obverse surface conductive layer arranged on the obverse surface and a reverse surface conductive layer arranged on the reverse surface,
the obverse surface conductive layer includes: a first connection portion to which a control signal output terminal of one of the gate driver ICs; a second connection portion to which the gate electrode of a corresponding one of the switching elements; and a first wiring portion that is interposed between the first connection portion and the second connection portion,
the power conversion device further comprises at least one obverse surface-side first electronic component that is mounted on the obverse surface and forms a circuit portion connecting the first connection portion and the second connection portion together with the first wiring portion,
the first wiring portion is connected to no conductive member penetrating through the base in the thickness direction.

Clause 2.
The power conversion device according to Clause 1, wherein the conductive portion includes a first intermediate conductive layer located between the obverse surface conductive layer and the reverse surface conductive layer in the thickness direction.

Clause 3.
The power conversion device according to Clause 2, wherein the thickness of the first intermediate conductive layer is less than each of the thicknesses of the obverse surface conductive layer and the reverse surface conductive layer.

Clause 4.
The power conversion device according to Clause 2 or 3, wherein the distance between the obverse surface conductive layer and the first intermediate conductive layer is smaller than each of the thicknesses of the obverse surface conductive layer and the first intermediate conductive layer.

Clause 5.
The power conversion device according to any one of Clauses 2 to 4, wherein the conductive portion includes a second intermediate conductive layer located between the first intermediate conductive layer and the reverse surface conductive layer in the thickness direction.

Clause 6.
The power conversion device according to Clause 5, wherein the thickness of the second intermediate conductive layer is less than each of the thicknesses of the obverse surface conductive layer and the reverse surface conductive layer.

Clause 7.
The power conversion device according to Clause 5 or 6, wherein the distance between the reverse surface conductive layer and the second intermediate conductive layer is smaller than each of the thicknesses of the reverse surface conductive layer and the second intermediate conductive layer.

Clause 8.
The power conversion device according to any one of Clauses 5 to 7, wherein the distance between the first intermediate conductive layer and the second intermediate conductive layer is greater than each of the thicknesses of the obverse surface conductive layer, the reverse surface conductive layer, the first intermediate conductive layer, and the second intermediate conductive layer.

Clause 9.
The power conversion device according to any one of Clauses 5 to 8, wherein the first intermediate conductive layer includes a first ground pattern portion connected to ground wiring.

Clause 10.
The power conversion device according to Clause 9, wherein the second intermediate conductive layer includes a second ground pattern portion connected to ground wiring.

Clause 11.
The power conversion device according to Clause 10, wherein the second intermediate conductive layer includes a power source pattern portion connected to power source wiring, and the power source pattern portion overlaps with the first ground pattern portion as viewed along the thickness direction.

Clause 12.
The power conversion device according to any one of Clauses 5 to 11, wherein the obverse surface conductive layer includes: a third connection portion to which a Miller clamp terminal of the above-mentioned one of the gate driver ICs; and a second wiring portion that is interposed between the third connection portion and the second connection portion,
the power conversion device further comprises at least one obverse surface-side second electronic component that is mounted on the obverse surface and forms a circuit portion connecting the third connection portion and the second connection portion together with the second wiring portion, and
the second wiring portion is connected to no conductive member penetrating through the base in the thickness direction.

Clause 13.
The power conversion device according to any one of Clauses 5 to 12, wherein the reverse surface conductive layer includes a third wiring portion electrically connected to the second connection portion and a fourth wiring portion connected to ground wiring, and
the power conversion device further comprises at least one reverse surface-side electronic component that is mounted on the reverse surface and is electrically connected to the third wiring portion and the fourth wiring portion.

Clause 14.

The power conversion device according to any one of Clauses 5 to 13, wherein the obverse surface conductive layer includes a first input pattern portion that is electrically connected to an external positive electrode-side input terminal,
- the reverse surface conductive layer includes a second input pattern portion that is connected to internal negative electrode-side input terminals of an upper arm circuit and a lower arm circuit formed by the switching elements,
- the first intermediate conductive layer includes a third input pattern portion,
- the second intermediate conductive layer includes a fourth input pattern portion,
- the first input pattern portion, the second input pattern portion, the third input pattern portion, and the fourth input pattern portion overlap with each other as viewed along the thickness direction, and
- the conductive portion includes a through-out conductive portion that electrically connects the second input pattern portion, the third input pattern portion, and the fourth input pattern portion to each other, and a shunt resistor portion that electrically connects the first input pattern portion and the second input pattern portion to each other.

Clause 15.

The power conversion device according to Clause 14, wherein the conductive portion includes:
- a plurality of through-out conductive portions; and
- a through-out conductive member that penetrates through and electrically connects the first input pattern portion, the second input pattern portion, the third input pattern portion, and the fourth input pattern portion to each other, with a portion of the through-out conductive member forming the shunt resistor portion.

Clause 16.

The power conversion device according to Clause 15, wherein an electric resistance of the plurality of through-out conductive portions is smaller than an electric resistance of the through-out conductive member.

Clause 17.

The power conversion device according to any one of Clauses 1 to 16, wherein each of the gate driver ICs includes an analog power source input terminal, a ground terminal, and a digital signal input terminal, and
the conductive portion includes:
- an analog ground wiring portion connected to the ground terminal; and
- a digital ground wiring portion that is connected to the analog ground wiring portion via a coil component.

Clause 18.

The power conversion device according to any one of Clauses 1 to 17, wherein the switching elements are SiC-MOSFETs.

The invention claimed is:

1. A power conversion device including:
a plurality of switching elements that each have a gate electrode, a source electrode, and a drain electrode;
a plurality of gate driver ICs configured to perform drive control of the plurality of switching elements, respectively; and
a substrate on which the plurality of gate driver ICs are mounted,
wherein the substrate includes: an insulating base having an obverse surface and a reverse surface that face mutually opposite sides in a thickness direction; and a conductive portion that is supported by the base,
the conductive portion includes an obverse surface conductive layer arranged on the obverse surface and a reverse surface conductive layer arranged on the reverse surface,
the obverse surface conductive layer includes: a first connection portion to which a control signal output terminal of one of the gate driver ICs; a second connection portion to which the gate electrode of a corresponding one of the switching elements; and a first wiring portion that is interposed between the first connection portion and the second connection portion,
the power conversion device further comprises at least one obverse surface-side first electronic component that is mounted on the obverse surface and forms a circuit portion connecting the first connection portion and the second connection portion together with the first wiring portion,
the first wiring portion is connected to no conductive member penetrating through the base in the thickness direction.

2. The power conversion device according to claim 1, wherein the conductive portion includes a first intermediate conductive layer located between the obverse surface conductive layer and the reverse surface conductive layer in the thickness direction.

3. The power conversion device according to claim 2, wherein a thickness of the first intermediate conductive layer is less than each of thicknesses of the obverse surface conductive layer and the reverse surface conductive layer.

4. The power conversion device according to claim 2, wherein a distance between the obverse surface conductive layer and the first intermediate conductive layer is smaller than each of thicknesses of the obverse surface conductive layer and the first intermediate conductive layer.

5. The power conversion device according to claim 2, wherein the conductive portion includes a second intermediate conductive layer located between the first intermediate conductive layer and the reverse surface conductive layer in the thickness direction.

6. The power conversion device according to claim 5, wherein a thickness of the second intermediate conductive layer is less than each of thicknesses of the obverse surface conductive layer and the reverse surface conductive layer.

7. The power conversion device according to claim 5, wherein a distance between the reverse surface conductive layer and the second intermediate conductive layer is smaller than each of thicknesses of the reverse surface conductive layer and the second intermediate conductive layer.

8. The power conversion device according to claim 5, wherein a distance between the first intermediate conductive layer and the second intermediate conductive layer is greater than each of thicknesses of the obverse surface conductive layer, the reverse surface conductive layer, the first intermediate conductive layer, and the second intermediate conductive layer.

9. The power conversion device according to claim 5, wherein the first intermediate conductive layer includes a first ground pattern portion connected to ground wiring.

10. The power conversion device according to claim 9, wherein the second intermediate conductive layer includes a second ground pattern portion connected to ground wiring.

11. The power conversion device according to claim 10, wherein the second intermediate conductive layer includes a power source pattern portion connected to power source wiring, and the power source pattern portion overlaps with the first ground pattern portion as viewed along the thickness direction.

12. The power conversion device according to claim 5, wherein the obverse surface conductive layer includes: a third connection portion to which a Miller clamp terminal of the above-mentioned one of the gate driver ICs; and a second wiring portion that is interposed between the third connection portion and the second connection portion, the power conversion device further comprises at least one obverse surface-side second electronic component that is mounted on the obverse surface and forms a circuit portion connecting the third connection portion and the second connection portion together with the second wiring portion, and the second wiring portion is connected to no conductive member penetrating through the base in the thickness direction.

13. The power conversion device according to claim 5, wherein the reverse surface conductive layer includes a third wiring portion that is electrically connected to the second connection portion and a fourth wiring portion that is connected to ground wiring, and the power conversion device further comprises at least one reverse surface-side electronic component that is mounted on the reverse surface and is electrically connected to the third wiring portion and the fourth wiring portion.

14. The power conversion device according to claim 5, wherein the obverse surface conductive layer includes a first input pattern portion that is electrically connected to an external positive electrode-side input terminal, the reverse surface conductive layer includes a second input pattern portion that is connected to internal negative electrode-side input terminals of an upper arm circuit and a lower arm circuit formed by the switching elements, the first intermediate conductive layer includes a third input pattern portion, the second intermediate conductive layer includes a fourth input pattern portion, the first input pattern portion, the second input pattern portion, the third input pattern portion, and the fourth input pattern portion overlap with each other as viewed along the thickness direction, and the conductive portion includes a through-out conductive portion that electrically connects the second input pattern portion, the third input pattern portion, and the fourth input pattern portion to each other, and a shunt resistor portion that electrically connects the first input pattern portion and the second input pattern portion to each other.

15. The power conversion device according to claim 14, wherein the conductive portion includes:

a plurality of through-out conductive portions; and a through-out conductive member that penetrates through and electrically connects the first input pattern portion, the second input pattern portion, the third input pattern portion, and the fourth input pattern portion to each other, with a portion of the through-out conductive member forming the shunt resistor portion.

16. The power conversion device according to claim 15, wherein an electric resistance of the plurality of through-out conductive portions is smaller than an electric resistance of the through-out conductive member.

17. The power conversion device according to claim 1, wherein each of the gate driver ICs includes an analog power source input terminal, a ground terminal, and a digital signal input terminal, and the conductive portion includes:

an analog ground wiring portion connected to the ground terminal; and a digital ground wiring portion that is connected to the analog ground wiring portion via a coil component.

18. The power conversion device according to claim 1, wherein the switching elements are SiC-MOSFETs.

* * * * *